(12) United States Patent
Won et al.

(10) Patent No.: US 9,711,543 B2
(45) Date of Patent: Jul. 18, 2017

(54) LIQUID CRYSTAL DISPLAY AND METHOD FOR MANUFACTURING THE SAME

(71) Applicant: LG Display Co., Ltd., Seoul (KR)

(72) Inventors: DaeHyun Won, Daegu (KR); Mokkyu Jin, Gyeongsangbuk-do (KR); DongKon Kwak, Gyeongsangbuk-do (KR); AhReum Kong, Gyeongsangbuk-do (KR)

(73) Assignee: LG Display Co., Ltd., Seoul (KR)

( * ) Notice: Subject to any disclaimer, the term of this patent is extended or adjusted under 35 U.S.C. 154(b) by 122 days.

(21) Appl. No.: 14/554,239

(22) Filed: Nov. 26, 2014

(65) Prior Publication Data
US 2015/0153600 A1 Jun. 4, 2015

(30) Foreign Application Priority Data

Nov. 29, 2013 (KR) .................. 10-2013-0147736
Oct. 7, 2014 (KR) .................. 10-2014-0135230

(51) Int. Cl.
| | | |
|---|---|---|
| *G02F 1/1368* | (2006.01) | |
| *G02F 1/1343* | (2006.01) | |
| *H01L 27/12* | (2006.01) | |
| *G02F 1/1362* | (2006.01) | |

(52) U.S. Cl.
CPC ...... *H01L 27/127* (2013.01); *G02F 1/134363* (2013.01); *G02F 2001/13629* (2013.01); *G02F 2001/134318* (2013.01)

(58) Field of Classification Search
CPC .................. H01L 27/127; G02F 1/134363
See application file for complete search history.

(56) References Cited

U.S. PATENT DOCUMENTS

| | | |
|---|---|---|
| 7,671,954 B2 | 3/2010 | Kim et al. |
| 2006/0146256 A1 | 7/2006 | Ahn et al. |
| 2008/0182184 A1 | 7/2008 | Zhan |
| 2009/0323005 A1 | 12/2009 | Ota et al. |

(Continued)

FOREIGN PATENT DOCUMENTS

| | | |
|---|---|---|
| CN | 101013174 A | 8/2007 |
| CN | 101097333 A | 1/2008 |

(Continued)

OTHER PUBLICATIONS

Taiwanese Office Action dated Sep. 30, 2015, for corresponding Patent Application No. 103141066.

(Continued)

*Primary Examiner* — Joseph L Williams
(74) *Attorney, Agent, or Firm* — Morgan, Lewis & Bockius LLP

(57) ABSTRACT

A liquid crystal display device includes a gate line and a data line disposed on a substrate; a thin film transistor (TFT) provided between the gate line and the data line; a pixel electrode positioned on the entire surface of a pixel region of the substrate; an insulating layer positioned on the entire surface of the substrate and exposing the TFT and the pixel electrode; a pixel electrode connection pattern electrically connecting the pixel electrode and the TFT on the insulating layer; and a plurality of common electrodes overlapping the pixel electrode and spaced apart from one another; and metal layer patterns provided on the common electrode overlapping at least one of the data line and the gate line.

12 Claims, 24 Drawing Sheets

(56) References Cited

U.S. PATENT DOCUMENTS

| | | | |
|---|---|---|---|
| 2011/0080549 A1 | 4/2011 | Jung et al. | |
| 2011/0227851 A1 | 9/2011 | Oh et al. | |
| 2012/0069286 A1 | 3/2012 | Huang et al. | |
| 2012/0086881 A1 | 4/2012 | Kim et al. | |

FOREIGN PATENT DOCUMENTS

| | | |
|---|---|---|
| CN | 102033376 A | 4/2011 |
| CN | 102135691 A | 7/2011 |
| CN | 102193230 A | 9/2011 |
| CN | 102967977 A | 3/2013 |
| JP | 2008242374 A | 10/2008 |
| JP | 2010008758 A | 1/2010 |
| KR | 101167304 B1 | 7/2012 |
| TW | 201238055 A | 9/2012 |

OTHER PUBLICATIONS

Korean Office Action dated Oct. 26, 2015, for corresponding Patent Application No. 10-2014-0135230.
The First Office Action dated Apr. 1, 2017 from the State Intellectual Property Office of the People's Republic of China of counterpart Chinese Application No. 201410696911.2.

(a)        (b)

(a)

(b)

LIQUID CRYSTAL DISPLAY AND METHOD FOR MANUFACTURING THE SAME

CROSS-REFERENCE TO RELATED APPLICATION

Pursuant to 35 U.S.C. §119(a), this application claims the benefit of earlier filing date and right of priority to Korean Application Nos. 10-2013-0147736, filed on Nov. 29, 2013, and 10-2014-0135230, filed on Oct. 7, 2014, the contents of both which are incorporated by reference herein in its entirety.

BACKGROUND OF THE INVENTION

1. Field of the Invention

The present disclosure relates to a liquid crystal display and, more particularly, to a fringe field switching (FFS) mode liquid crystal display in which resistance of a common electrode is reduced, and a manufacturing method thereof.

2. Background of the Invention

In general, a driving principle of a liquid crystal display (LCD) uses optical anisotropy and polarization of liquid crystal. Since liquid crystal is thin and long in structure, having molecule arrangement directionality, and alignment of molecular arrangement may be controlled by artificially applying an electrical field to liquid crystal.

Thus, when a direction of a molecule arrangement is adjusted, a molecule arrangement of liquid crystal is changed and light is refracted in the direction of the molecule arrangement of liquid crystal due to optical anisotropy, expressing image information.

Currently, an active matrix (AM)-liquid crystal display (LCD) in which thin film transistors (TFTs) and pixel electrodes connected to the TFTs are arranged in matrix form has come to prominence due to excellent resolution and video implementation capability.

The LCD includes a color filter substrate (i.e., an upper substrate) on which a common electrode is formed, an array substrate (i.e., a lower substrate) on which pixel electrodes are formed, and liquid crystal filling a gap between the upper substrate and the lower substrate. In the LCD, the liquid crystal is driven by an electrical field applied up and down to the common electrode and the pixel electrodes, exhibiting excellent transmissivity, aspect ratio, and the like.

However, driving liquid crystal by an electric field applied up and down is disadvantageous in that viewing angle characteristics are not good.

Thus, in order to overcome the shortcomings, a fringe field switching (FFS)-mode liquid crystal driving method has been newly proposed. A method for driving liquid crystal based on the FFS mode provides excellent viewing angle characteristics.

An existing FFS-mode LCD device having the forgoing advantages will be described with reference to FIGS. 1 through 3.

FIG. 1 is a plan view of an array substrate of an FFS-mode LCD according to a related art.

FIG. 2 is a cross-sectional view taken along lines IIa-IIa and IIb-IIb of FIG. 1, illustrating an array substrate of the related art FFS-mode LCD.

Referring to FIGS. 1 and 2, an array substrate 10 for the related art FFS-mode LCD includes a plurality of gate lines 13 extending in one direction and parallel with each other on a substrate 11; a plurality of data lines 23 intersecting the gate lines 13 to define pixel regions in intersections therebetween; and TFTs each formed at the intersections between the gate lines 13 and the data lines 23 and each including a gate electrode 13a, an active layer 19, a source electrode 23a, and a drain electrode 23b.

A large transparent pixel electrode 15 is disposed to be spaced apart from the gate lines 13 and the data lines 23, and a plurality of bar-shaped common electrodes 29a formed of a transparent ITO material are disposed above the pixel electrode 15 with a gate insulating layer 17 and a passivation layer 25 interposed therebetween and common electrodes 29b overlapped with the gate line 13 and the data line 23.

The pixel electrode 15 is electrically connected to the drain electrode 23b through a drain electrode connection pattern 29c in contact with the drain electrode 23b through a drain contact hole 27a and a pixel electrode contact hole 27b formed in the passivation layer 25 and the gate insulating layer 17. A ohmic contact layer 21 is disposed at between the active layer 19 and the source/drain electrodes.

FIG. 3 is a cross-sectional view illustrating a common electrode having a single layer structure overlapped on the data line and the gate line in the array substrate for the related art FFS-mode LCD, in which (a) is a cross-sectional view illustrating a common electrode overlapped on the data line and (b) is a cross-sectional view illustrating a common electrode overlapped on the gate line.

Referring to (a) and (b) of FIG. 3, the common electrodes 29b overlap the gate line 13 and the data line 23 with the passivation layer 25 interposed therebetween, respectively, are configured as a single layer, and formed of a transparent conductive material.

According to the configuration, when a data signal is supplied to the pixel electrode 15 through the TFT T, a fringe field is formed between the common electrodes 29a and 29b to which a common voltage has been supplied and the pixel electrode 15, and thus, liquid crystal molecules arranged in a horizontal direction between the TFT substrate 11 and the color filter substrate (not shown) are rotated due to dielectric anisotropy, and as transmissivity of light passing through the pixel region is varied according to a degree of rotation of the liquid crystal molecules, a gray scale is implemented.

As described above, recent product models employing the related art FFS-mode LCD have been increased in size to satisfy product diversity together with high transmissivity in order to meet the requirements of high resolution.

However, the common electrode applied to existing medium-sized LCDs is formed of an ITO material having high specific resistance and applies a common voltage signal to the interior of a display region therethrough. Here, since the common electrode is formed of a transparent conductive material such as ITO, resistance of the common electrode is continuously increased, but due to an advantage of improvement of transmissivity, it is difficult to design an extra common line.

Also, due to the increase in resistance of the common electrode, the existing LCD has problems in which a quality risk such as a residual image, a color shift, and the like, is increased.

Also, in case of an existing large LCD, a common signal needs to be applied to the interior of the display region through an additional common line, but the disposition of the additional common line reduces transmissivity.

Thus, in case of a large LCD, since transmissivity needs to be continuously enhanced, the additional common line causing a degradation of transmissivity needs to be omitted.

SUMMARY OF THE INVENTION

Accordingly, the present invention is directed to a liquid crystal display device and method for manufacturing the same that substantially obviates one or more of the problems due to limitations and disadvantages of the related art.

An object of the present invention is to provide a fringe field switching (FFS)-mode liquid crystal display in which resistance of a common electrode is reduced and transmissivity is increased, and a manufacturing method thereof.

Additional features and advantages of the invention will be set forth in the description which follows, and in part will be apparent from the description, or may be learned by practice of the invention. The objectives and other advantages of the invention may be realized and attained by the structure particularly pointed out in the written description and claims hereof as well as the appended drawings.

To achieve these and other advantages and in accordance with the purpose of this specification, as embodied and broadly described herein, a liquid crystal display device comprises a gate line positioned in one direction on one surface of a substrate; a data line crossing the gate line to define a pixel region; a thin film transistor (TFT) provided at an intersection between the gate line and the data line; a pixel electrode positioned on the entire surface of the pixel region of the substrate; an insulating layer positioned on the entire surface of the substrate including the pixel electrode and the TFT and exposing the TFT and the pixel electrode; a pixel electrode connection pattern electrically connecting the pixel electrode and the TFT on the insulating layer and a plurality of common electrodes overlapping the pixel electrode and spaced apart from one another; and metal layer patterns provided on the common electrode overlapping at least one of the data line and the gate line.

In another aspect, a liquid crystal display device comprises a gate line positioned in one direction on one surface of a substrate; a gate insulating layer and an active layer positioned on a gate electrode extending from the gate line, a source electrode and a drain electrode spaced apart from one another based on a channel region of the active layer, and a data line extending from the source electrode and crossing the gate line to define a pixel region; a first insulating layer provided on the entire surface of the substrate; first and second common electrodes provided on the first insulating layer of the substrate including the pixel region; a metal layer pattern provided on the second common electrode overlapping at least any one of the data line and the gate line; a second insulating layer provided on the entire surface of the substrate including the metal layer pattern; and a plurality of pixel electrodes electrically connected to the drain electrode on the second insulating layer and overlapping the common electrodes.

In another aspect, a method for manufacturing a liquid crystal display device comprises simultaneously forming a gate line in one direction on one surface of a substrate, a gate electrode extending from the gate line, and a pixel electrode in a pixel region of the substrate through a masking process using a diffraction mask; forming an active layer above the gate electrode on the substrate, a source electrode and a drain electrode spaced apart from one another based on a channel region of the active layer on the active layer, and a data line extending from the source electrode and crossing the gate line; forming an insulating layer on the entire surface of the substrate including the data line and subsequently forming a pixel electrode contact hole exposing the pixel electrode and the drain electrode within the insulating layer; and simultaneously forming a pixel electrode, a plurality of common electrodes overlapping at least one of the data line and the gate line on the passivation layer, a pixel electrode connection pattern electrically connecting the pixel electrode and the drain electrode through the pixel electrode contact hole, on the passivation layer, and a metal layer pattern on the common electrode overlapping at least one of the data line and the gate line, through a masking process using a diffraction mask.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments and together with the description serve to explain the principles of the invention. In the drawings.

DETAILED DESCRIPTION OF THE INVENTION

Figure 1:
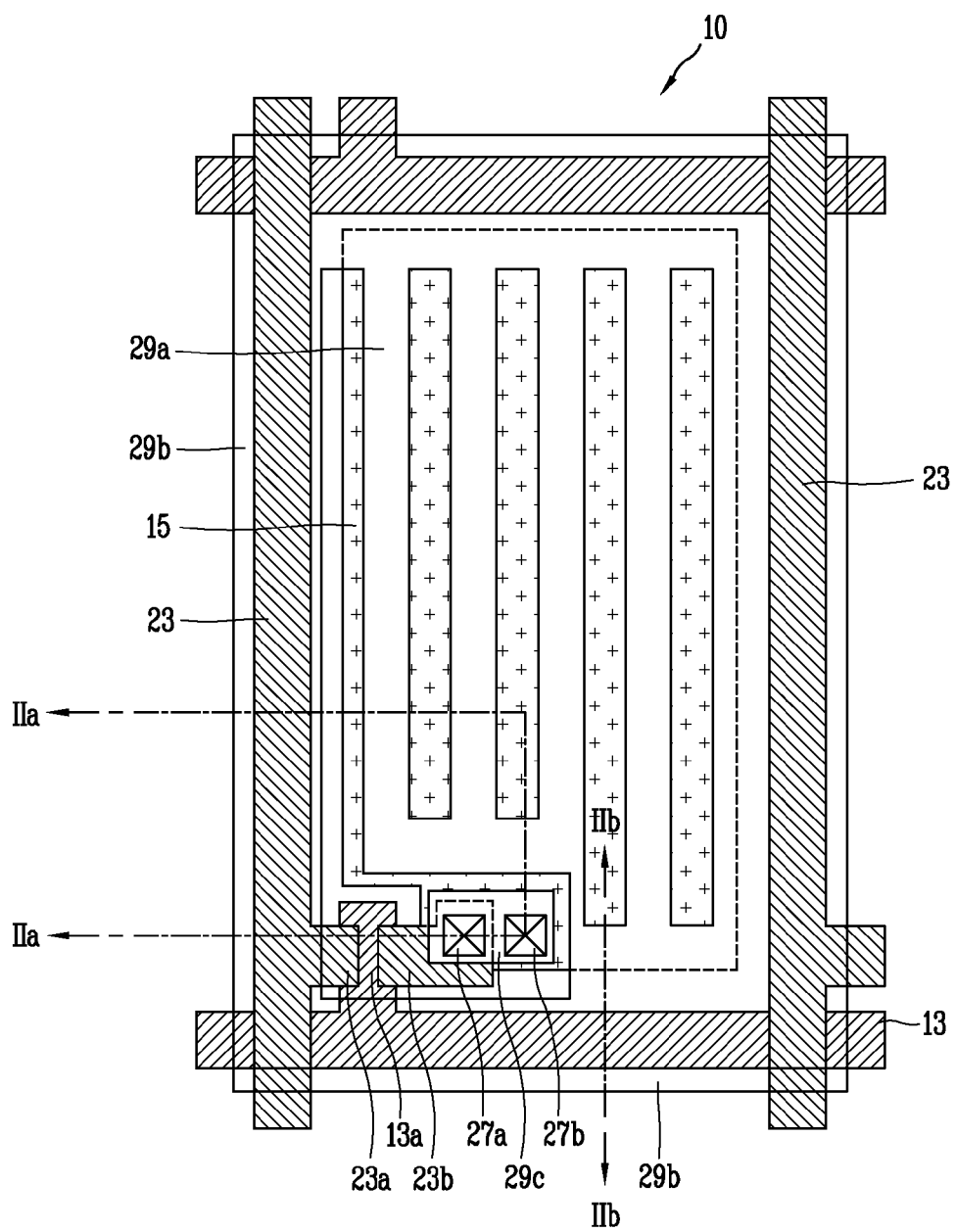
FIG. 1 is a plan view of an array substrate for a fringe field switching (FFS)-mode liquid crystal display according to the related art.
Figure 2:
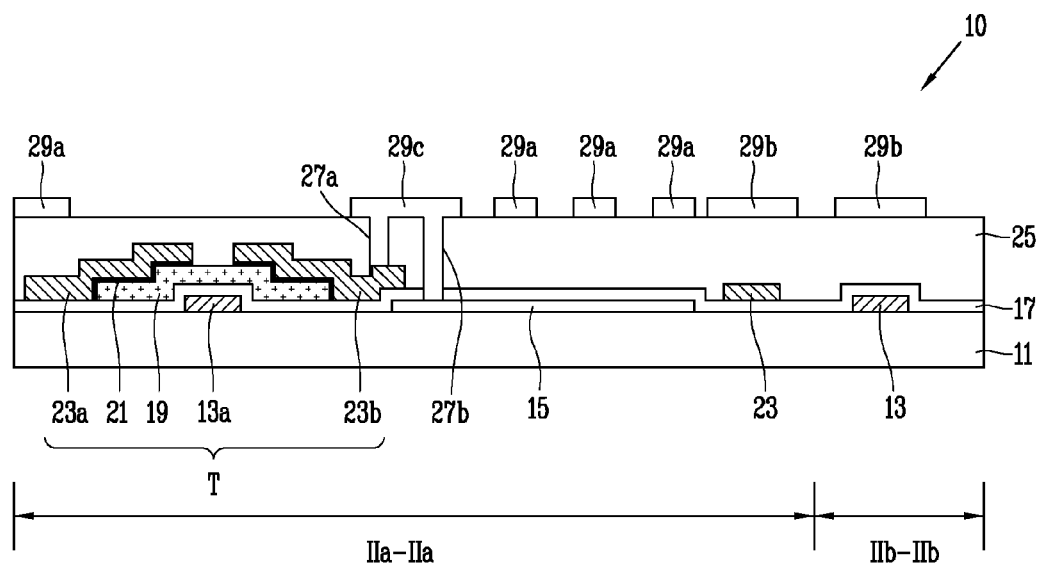
FIG. 2 is a cross-sectional view taken along lines IIa-IIa and IIb-IIb of FIG. 1, illustrating an array substrate of the related art FFS-mode LCD.
Figure 3:
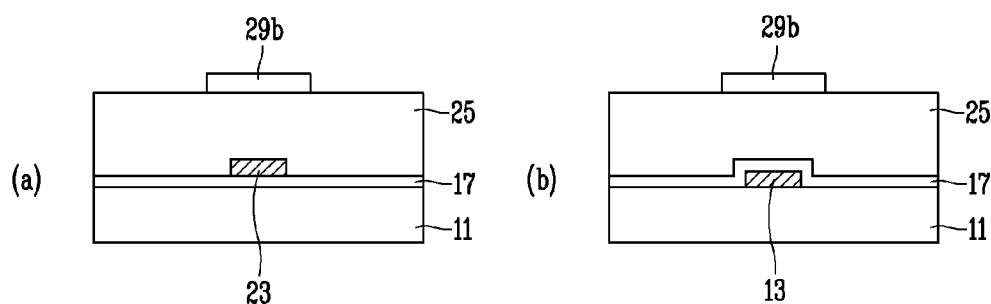
FIG. 3 includes views illustrating common electrodes having a single layer structure overlapped on a data line and a gate line in an array substrate for the related art FFS-mode LCD, in which (a) is a cross-sectional view illustrating a common electrode overlapped on the data line and (b) is a cross-sectional view illustrating a common electrode overlapped on the gate line.

Hereinafter, embodiments of the present disclosure will be described in detail with reference to the accompanying drawings. In adding reference numerals for elements in each figure, it should be noted that like reference numerals already used to denote like elements in other figures are used for elements wherever possible. Moreover, detailed descriptions related to well-known functions or configurations will be ruled out in order not to unnecessarily obscure subject matters of the present invention.

In describing the elements of the present invention, terms such as first, second, A, B, (a), (b), etc., may be used. Such terms are used for merely discriminating the corresponding elements from other elements and the corresponding elements are not limited in their essence, sequence, or precedence by the terms. It will be understood that when an element or layer is referred to as being "on" or "connected to" another element or layer, it can be directly on or directly connected to the other element or layer, or intervening elements or layers may be present. In the same context, it will be understood that when an element is referred to as being "on" or "beneath" another element, the element can be directly on the other element or indirectly formed with an intervening element therebetween.

Figure 4:
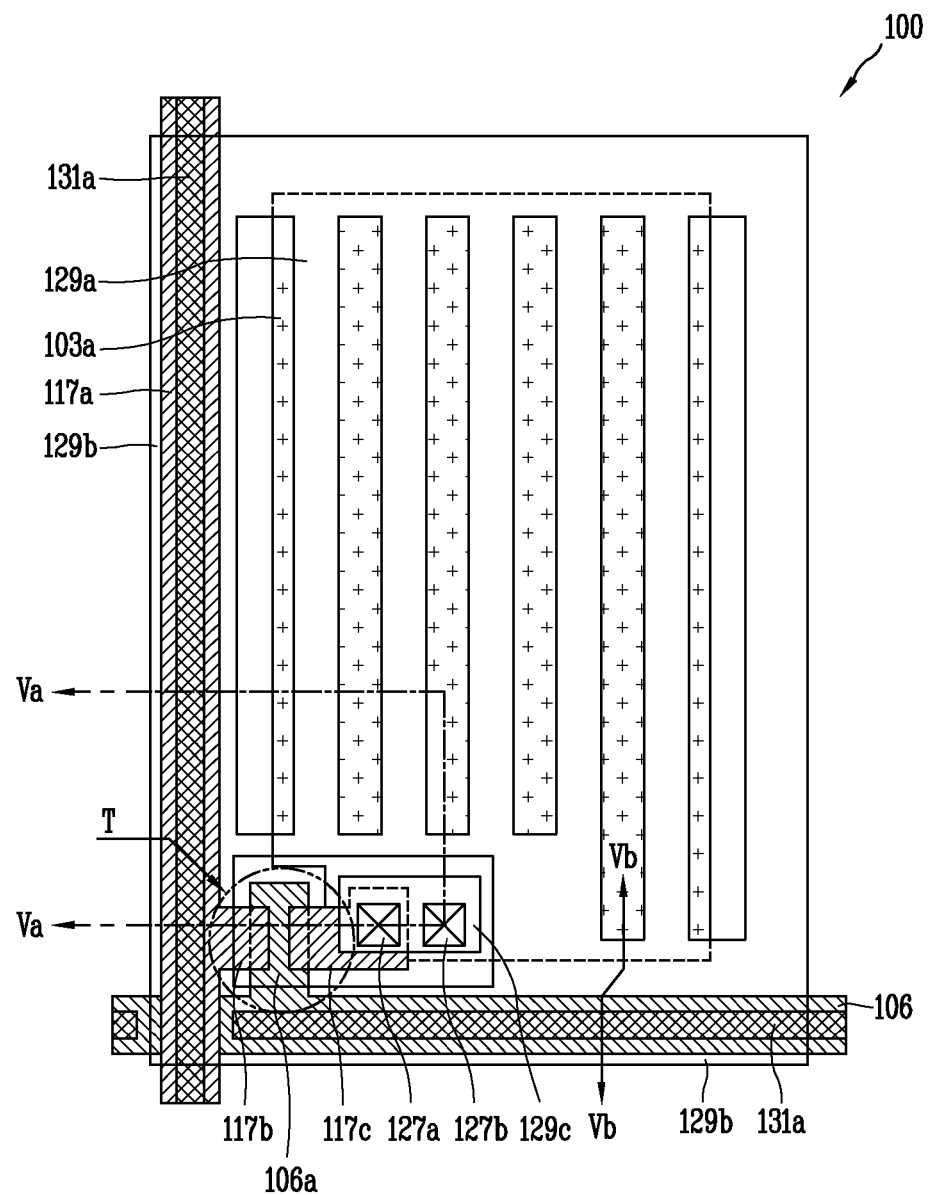
FIG. 4 is a plan view of an FFS-mode LCD device according to an embodiment of the present disclosure.

FIG. 4 is a plan view of an FFS-mode LCD device according to an embodiment of the present disclosure.

Figure 5:
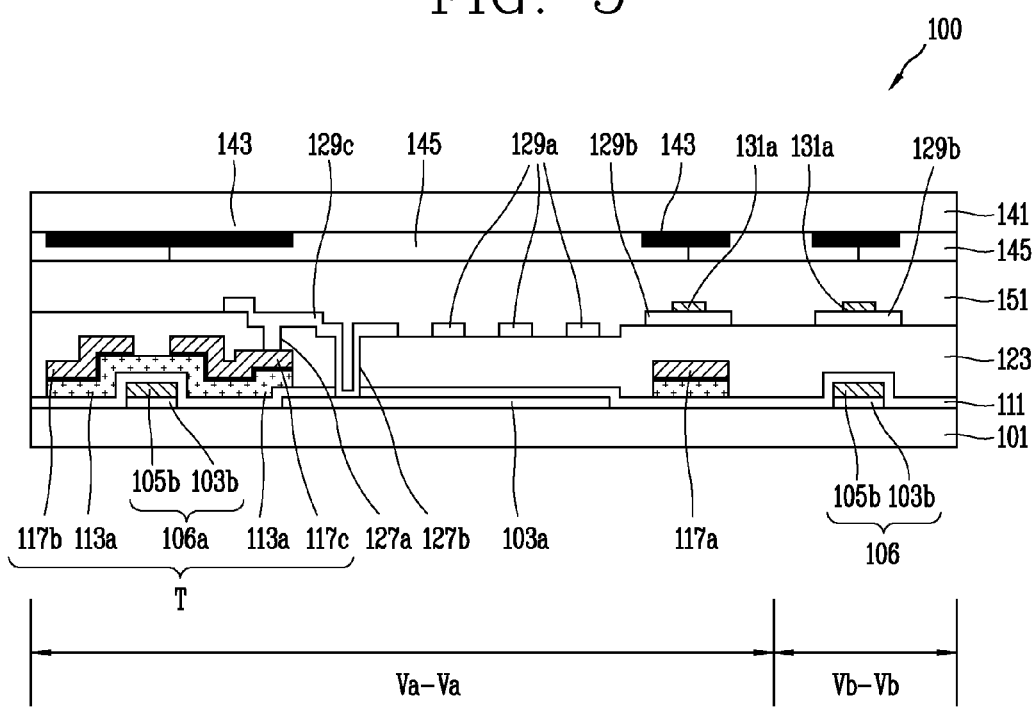
FIG. 5 is a cross-sectional view taken along lines Va-Va and Vb-Vb of FIG. 4, illustrating the FFS-mode LCD device according to an embodiment of the present disclosure.

FIG. 5 is a cross-sectional view taken along lines Va-Va and Vb-Vb of FIG. 4, illustrating the FFS-mode LCD device according to an embodiment of the present disclosure.

Drawings applied in the present disclosure illustrate an LCD device applied to a medium model, but the present disclosure is not limited thereto and the drawings may also be applied to a large model.

Referring to FIGS. 4 and 5, an FFS-mode LCD device 100 according to an embodiment of the present disclosure in which a common electrode is provided as a top structure includes a gate line 106 formed in one direction on one surface of an insulating substrate 101; a data line 117a crossing the gate line 106 to define a pixel region; a thin film transistor (TFT) T formed at the intersection of the gate line 106 and the data line 117a; a large pixel electrode 103a formed in a pixel region of the insulating substrate 101; a passivation layer 125 formed on the entire surface of the substrate including the pixel electrode 103a and the TFT T and having a drain contact hole 127a and a pixel electrode contact hole 127b respectively exposing the TFT T and the pixel electrode 103a; a plurality of first common electrodes formed on the passivation layer 123, spaced apart from one another, and overlapping the pixel electrode 103a and second common electrodes 129b formed on the passivation layer 123 and overlapping the data line 117a and the gate line 106; a metal layer pattern 131a formed on at least one of the second common electrodes 129b overlapping the data line 117a and the gate line 106; and a pixel electrode connection pattern 129c electrically connecting the pixel electrode 103a and the TFT T through the drain contact hole 127a and the pixel electrode contact hole 127b.

Here, the large transparent pixel electrode 103a is disposed to be spaced apart from the gate line 160 and the data line 117a on the surface of the pixel region of the insulating substrate 101, namely, the TFT substrate, and a plurality of bar-shaped first common electrodes 129a are disposed to be spaced apart above the pixel electrode 103a with the gate insulating layer 111 and the passivation layer 123 interposed therebetween, and the second common electrodes 129b are disposed on the gate line 106 and the data line 117a.

Here, the plurality of first common electrodes 129a has a single layer structure, and a metal layer pattern 131a may be formed on the second common electrode 129b overlapping at least one of the data line 117a and the gate line 106. For example, the metal layer pattern 131a may be formed on the second common electrode 129b overlapping the data line 117a or on the second common electrode 129b overlapping the gate line 106, to form a dual-layer structure.

Figure 6:
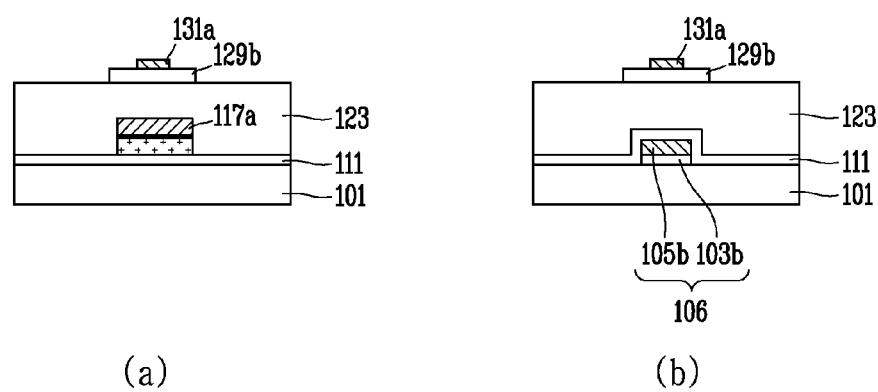
FIG. 6 includes cross-sectional views illustrating a second common electrode having a dual-layer structure overlapped on a data line and a gate line in a thin film transistor array substrate of an FFS-mode LCD device according to an embodiment of the present disclosure, in which (a) is a cross-sectional view illustrating the second common electrode overlapping a data line and (b) is a cross-sectional view illustrating the second common electrode overlapping a gate line.

FIG. 6 includes cross-sectional views illustrating a second common electrode having a dual-layer structure overlapped on a data line and a gate line in a thin film transistor array substrate of an FFS-mode LCD device according to an embodiment of the present disclosure, in which (a) is a cross-sectional view illustrating the second common electrode overlapping a data line and (b) is a cross-sectional view illustrating the second common electrode overlapping a gate line.

As illustrated in (a) and (b) of FIG. 6, the metal layer patterns 131a are stacked on the second common electrodes 129b respectively overlapping the data line 117a and the gate line 106 to form a dual-layer structure, and here, the second common electrode 129b is disposed on the passivation layer 123 to overlap the data line 117a. Here, it is illustrated that the third metal layer patterns 131a are formed on the second common electrodes 129b overlapping the data line 117a and the gate line 106, but the present disclosure is not limited thereto and, for example, in case of an LCD device of a large model, the third metal layer pattern 131a may be formed only on the second common electrode 129b overlapping the gate line 106 or the data line 117a.

This is because, in case of a large model LCD device, in the related art, a common line is additionally formed to reduce resistance of a common electrode. In this case, however, transmissivity is reduced. Thus, in the present disclosure, the metal layer pattern 131a is formed only on the common electrode 129b overlapping one of the data line 117a and the gate line 106, reducing resistance of the common electrode, and thus, transmissivity can be improved.

Also, the first common electrode 129a and the second common electrode 129b are integrally formed, and the metal layer pattern 131a is formed only on the second common electrode 129b. In this case, it may be advantageous to form the metal layer pattern 131a such that a line width thereof is narrower than those of the data line 117a and the gate line 106 in terms of a transmissivity, but the present disclosure is not limited thereto and the metal layer pattern 131a may be formed to have a line width equal to or greater than those of the data line 117a and the gate line 106.

Here, the first common electrodes 129a and the second common electrodes 129b may be formed of a transparent conductive material such as ITO or IZO.

The metal layer patterns 131a on the second common electrodes 129b may be formed of one or more selected from the conductive metal group consisting of aluminum (Al), tungsten (W), copper (Cu), molybdenum (Mo), chromium (Cr), titanium (Ti), moly-tungsten (MoW), moly-titanium (MoTi), copper/moly-titanium (Cu/MoTi) and may have a stacked structure.

The first and second common electrodes 129a and 129b may be formed to have a thickness ranging from 100 to 1000 Å, and the metal layer pattern 131a may be formed to have a thickness ranging from 500 to 3000 Å.

Thus, since the metal layer patterns 131a are stacked on the second common electrodes 129b to form the common electrode having a dual-layer structure, resistance of the common electrode can be reduced.

In this manner, a reference voltage, i.e., a common voltage, for driving liquid crystal is supplied to each pixel through the plurality of first and second common electrodes 129a and 129b. The first common electrodes 129a overlap the large pixel electrode 103a with the gate insulating layer 111 and the passivation layer 123 interposed therebetween in each pixel region to form a fringe field.

Also, as illustrated in FIG. 5, the TFT T includes a gate electrode 106a extending in a vertical direction from the gate line 106 formed on the insulating substrate 101, the gate insulating layer 111, an active layer 113a, and an ohmic contact layer 115a formed on the gate electrode 106a, and a source electrode 117b and a drain electrode 117c spaced apart from one another by a distance corresponding to a channel region of the active layer 113a.

The pixel electrode 103a is electrically connected to the drain electrode 117c below the drain contact hole 127a by the pixel electrode connection pattern 129c.

A lower alignment film (not shown) including the first and second common electrodes 129a and 129b are formed on the entire surface of the substrate.

A black matrix BM 143 for blocking light transmission to a region excluding the pixel region is formed on the color filter substrate 141 attached with the TFT substrate, namely, the insulating substrate 101 with a gap therebetween.

Red, green, and blue color filter layers 145 are formed in a pixel region of the color filter substrate 141. Here, the black matrix 143 is formed between the red, green, and blue color filter layers 145 on the color filter substrate 141.

When the color filter substrate 141 and the insulating substrate 101 as a TFT substrate are attached, the black matrix 143 is disposed to overlap regions excluding the pixel region, for example, the upper portions of the TFT T, the gate line 106, and the data line 117a. Here, a line width of the black matrix 143 overlapping the data line 117a may be equal to or smaller than that of the data line 117a. In particular, the second common electrode 129b is disposed above the data line 117a to cover the data line 117a, serving to block light to a degree, and thus, there is no problem even though the black matrix 143 is formed not to completely overlap the data line 117a. Namely, in the related art, the upper side of the data line is not shielded with the common electrode, a line width of the black matrix should be formed to be large enough to shield the data line, but in the present disclosure, the upper side of the data line 117a can be shielded with the second common electrode 129b, and thus, the black matrix 143 may not need to be formed to have a large line width, maximizing transmissivity as much.

Also, although not shown, an upper alignment film (not shown) is formed on the color filter layer 145 in order to align liquid crystal in a predetermined direction.

Thus, when a data signal is supplied to the pixel electrode 103a through the TFT T, a fringe field is formed between the first and second common electrodes 103a to which a common voltage has been applied and the pixel electrode 103a and liquid crystal molecules aligned in a horizontal direction between the insulating substrate 101 and the color filter substrate 141 rotate due to dielectric anisotropy, changing transmissivity of light that passes through the pixel region according to degrees of rotation of the liquid crystal molecules, thus implementing a gray scale.

In this manner, in the FFS mode LCD device according to an embodiment of the present disclosure in which a common electrode is applied as a top structure, the metal layer pattern is stacked on the common electrodes overlapping both the data line and the gate line or only on the common electrode overlapping one of the gate line and the data line to form the common electrode as a dual-layer structure, instead of the existing common electrode having a single layer structure formed of only a transparent conductive material. Thus, overall resistance of the common electrode is reduced, improving quality due to resistance of the common electrode.

Also, in the FFS mode LCD device according to an embodiment of the present disclosure in which a common electrode is applied as a top structure, since the overall resistance of the common electrode is reduced by stacking the metal layer pattern on the common electrodes overlapping both the data line and the gate line or only on the common electrode overlapping one of the gate line and the data line to form the common electrode as a dual-layer structure, there is no need to additionally form a common line, such as in the related art, in order to reduce resistance of the common electrode in applying to a large mode, transmissivity can be improved.

A method for manufacturing an FFS-mode LCD device according to an embodiment of the present disclosure configured as described above will be described with reference to FIGS. 7A through 7T.

Figure 7A:
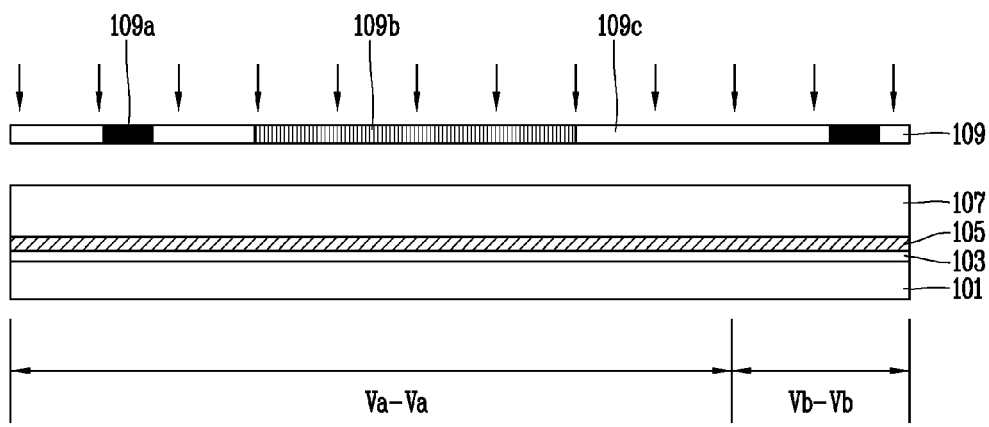
FIGS. 7A through 7T are cross-sectional views illustrating a process of manufacturing an FFS-mode LCD device according to an embodiment of the present disclosure.
Figure 7B:
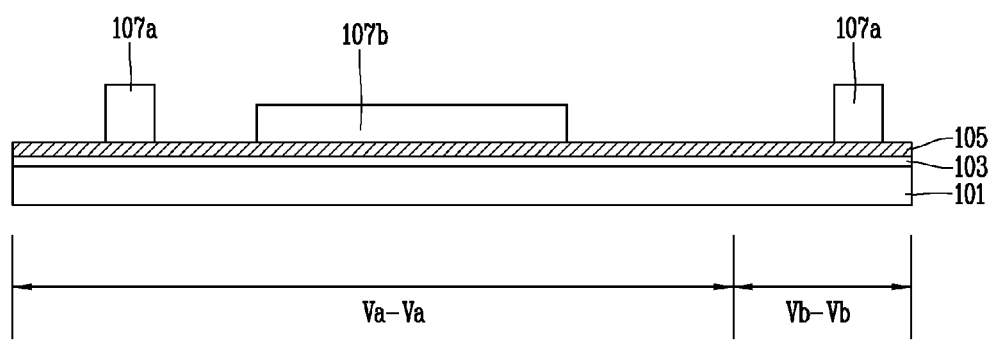
Figure 7C:
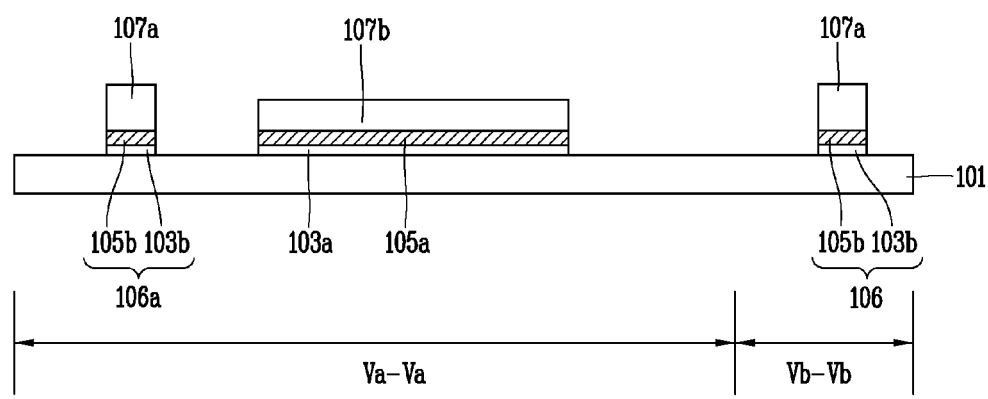
Figure 7D:
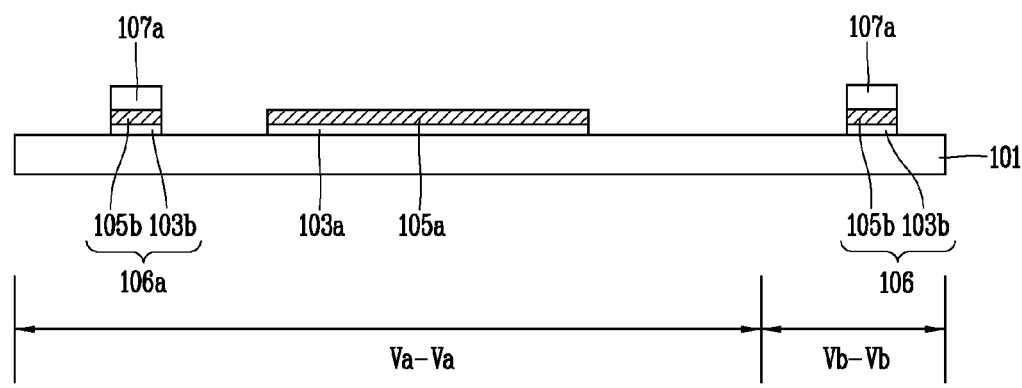
Figure 7E:
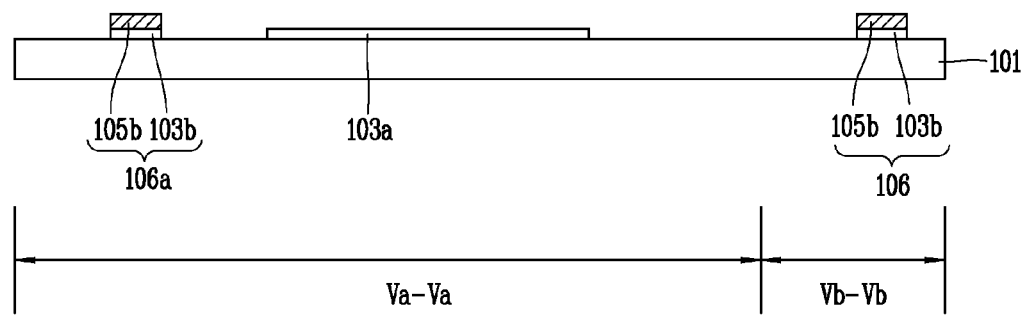
Figure 7F:
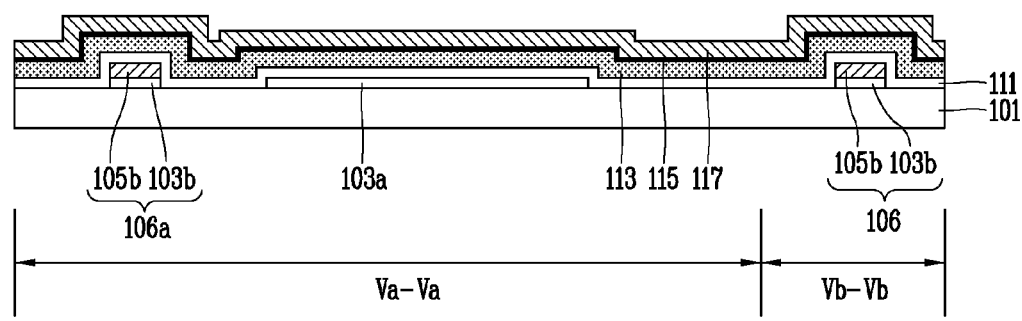
Figure 7G:
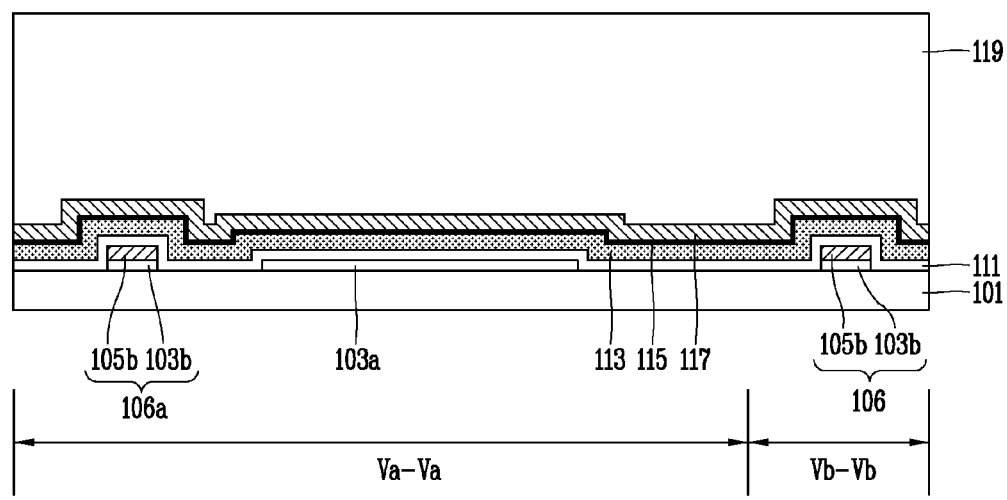
Figure 7H:
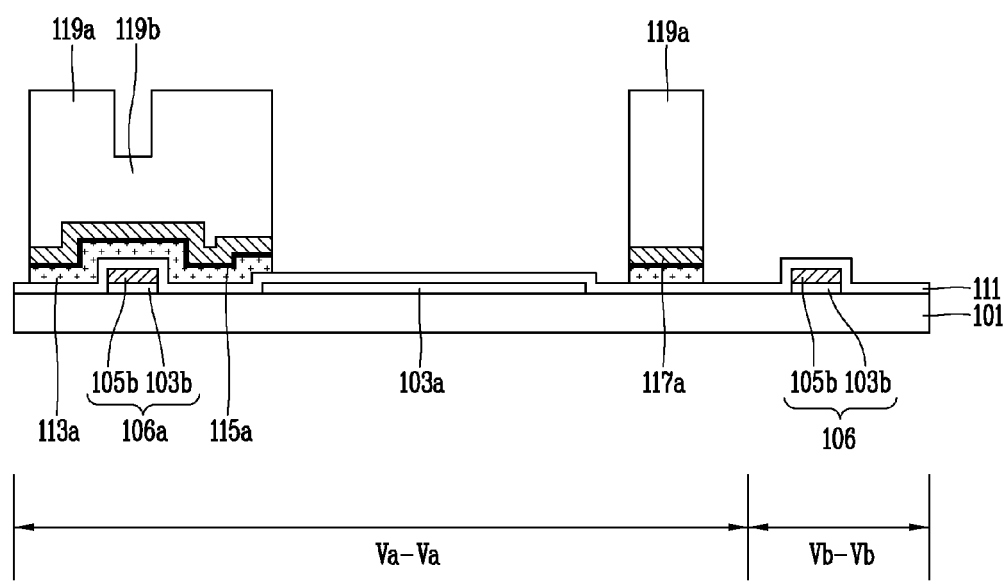
Figure 7I:
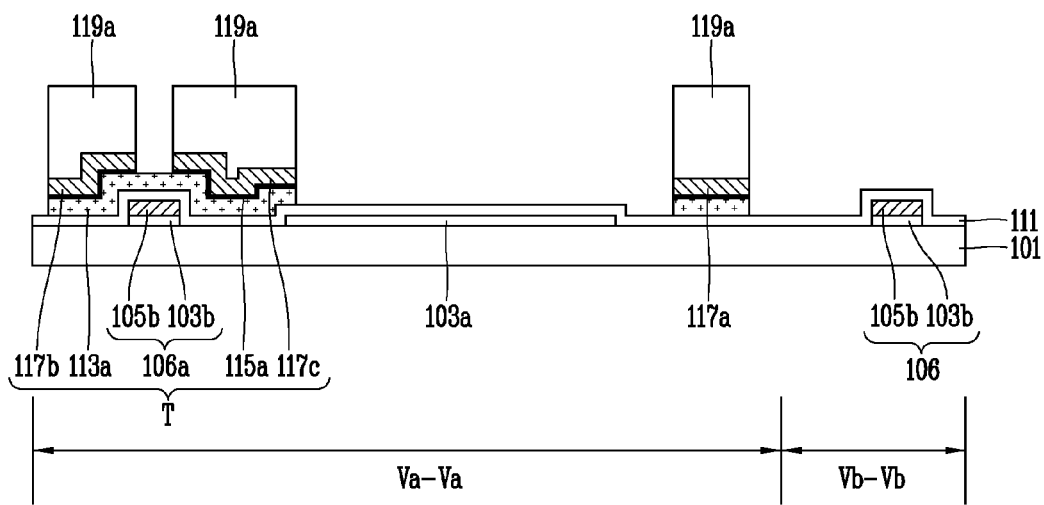
Figure 7J:
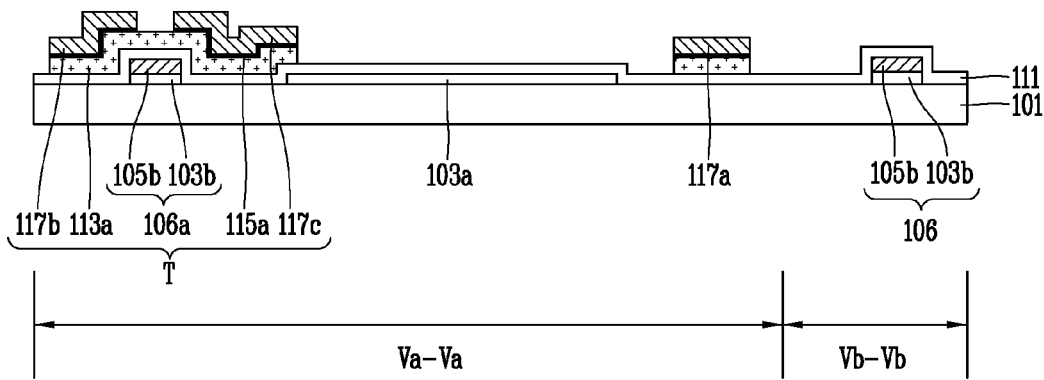
Figure 7K:
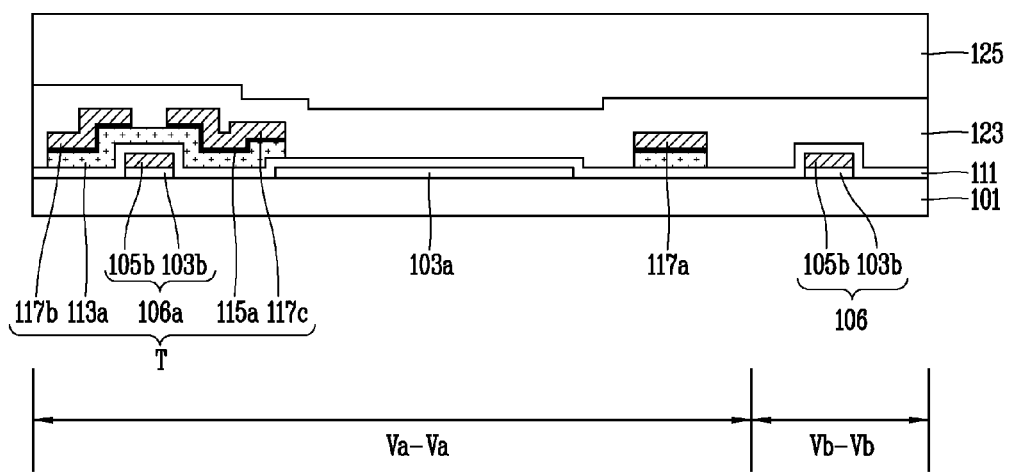
Figure 7L:
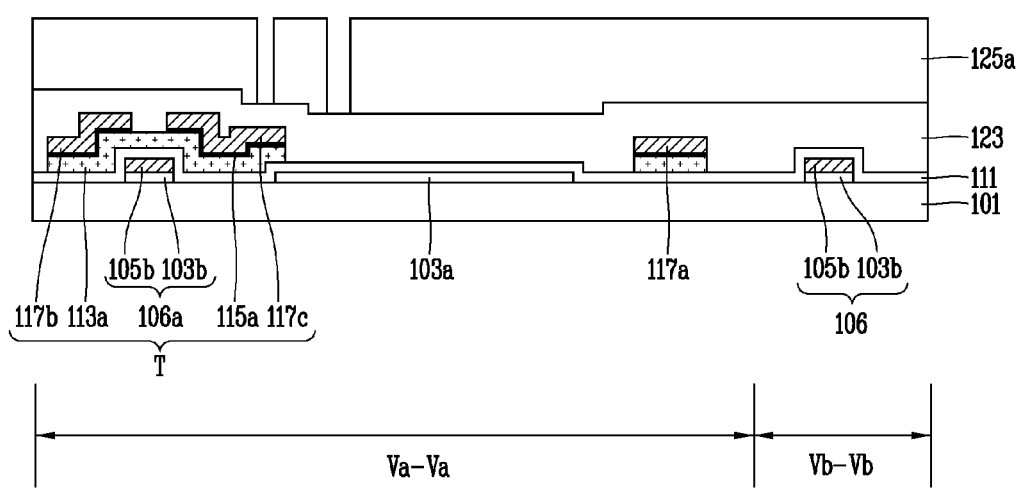
Figure 7M:
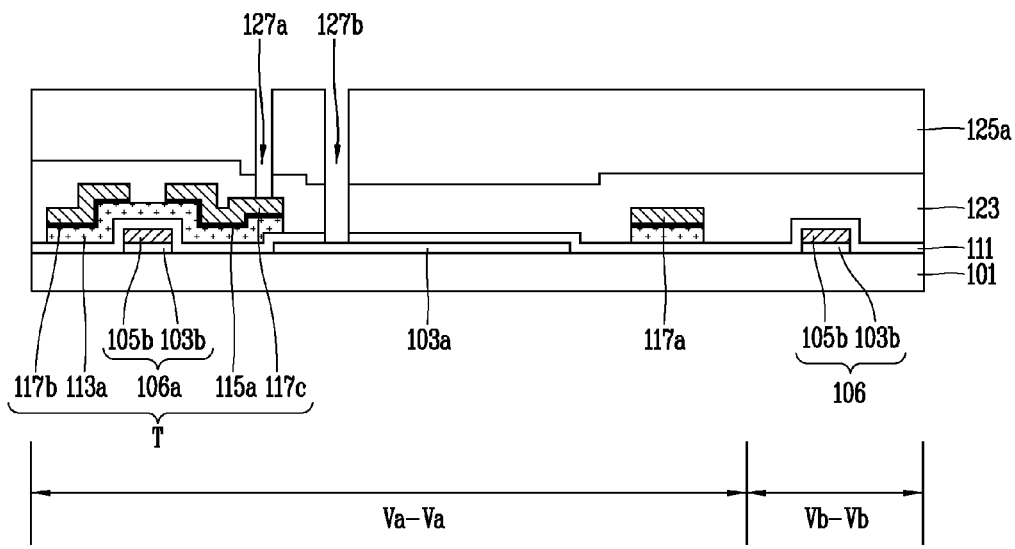
Figure 7N:
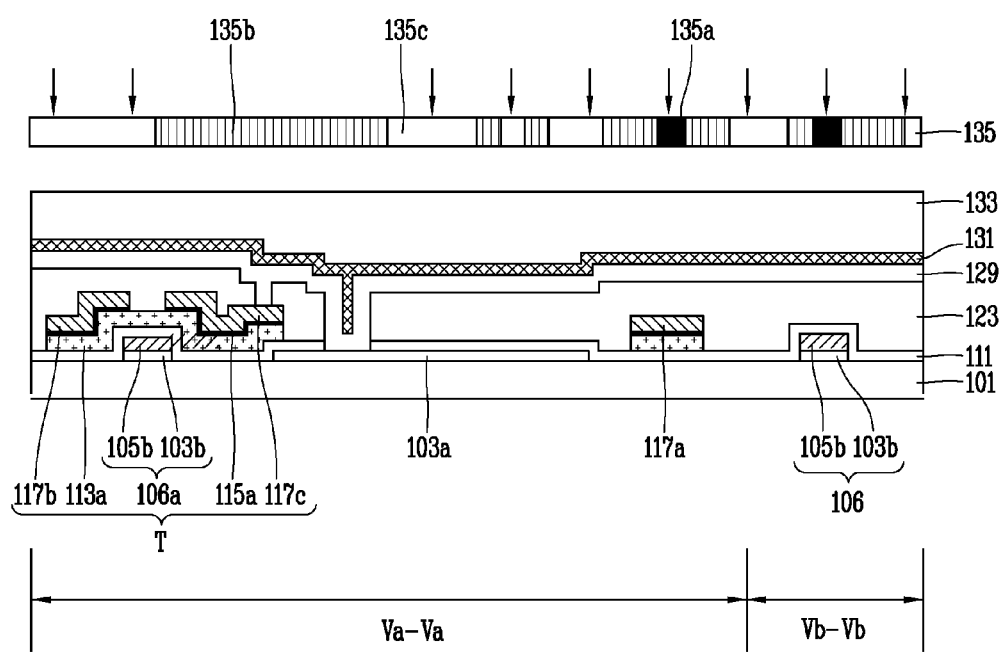
Figure 7O:
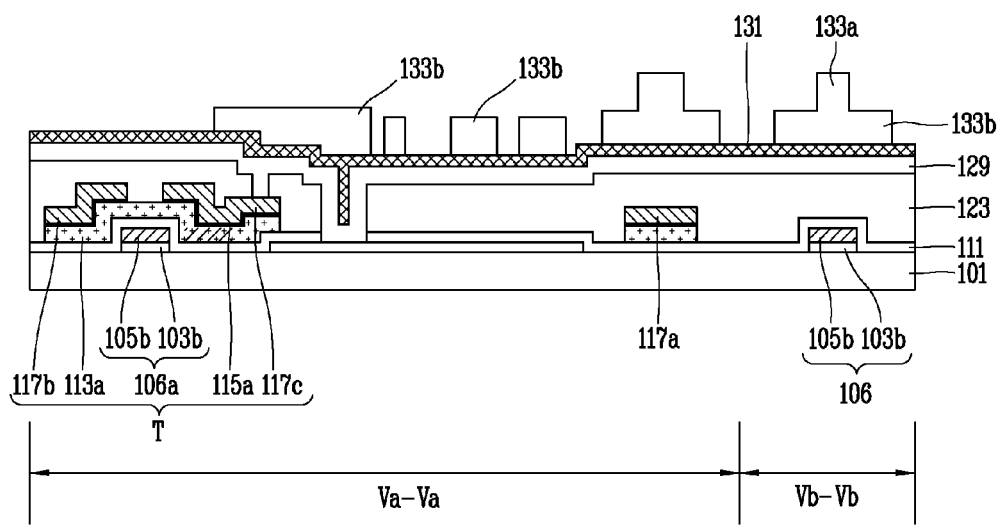
Figure 7P:
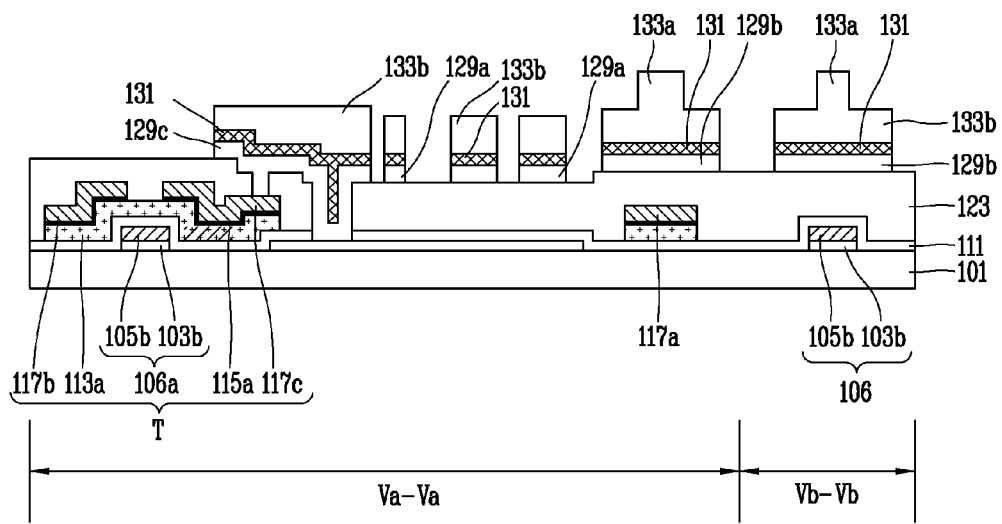
Figure 7Q:
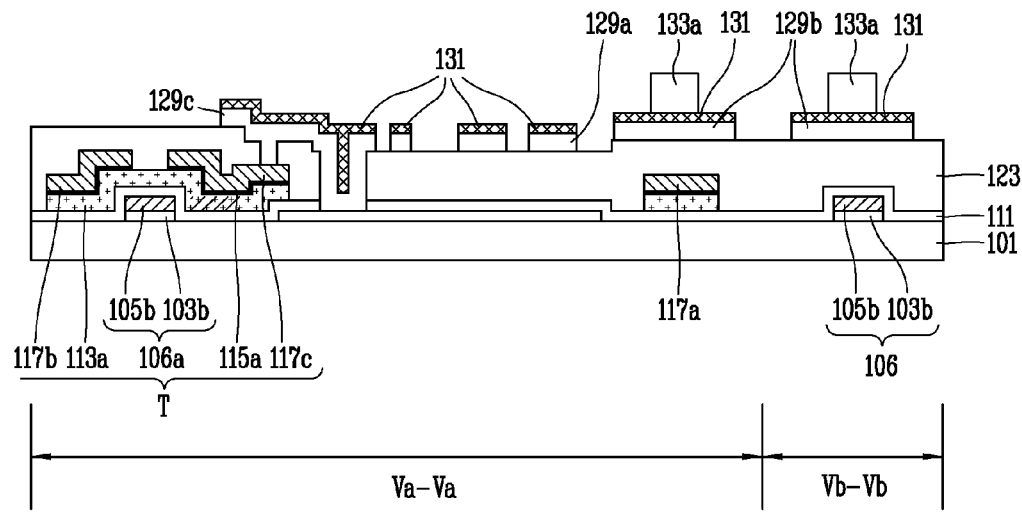
Figure 7R:
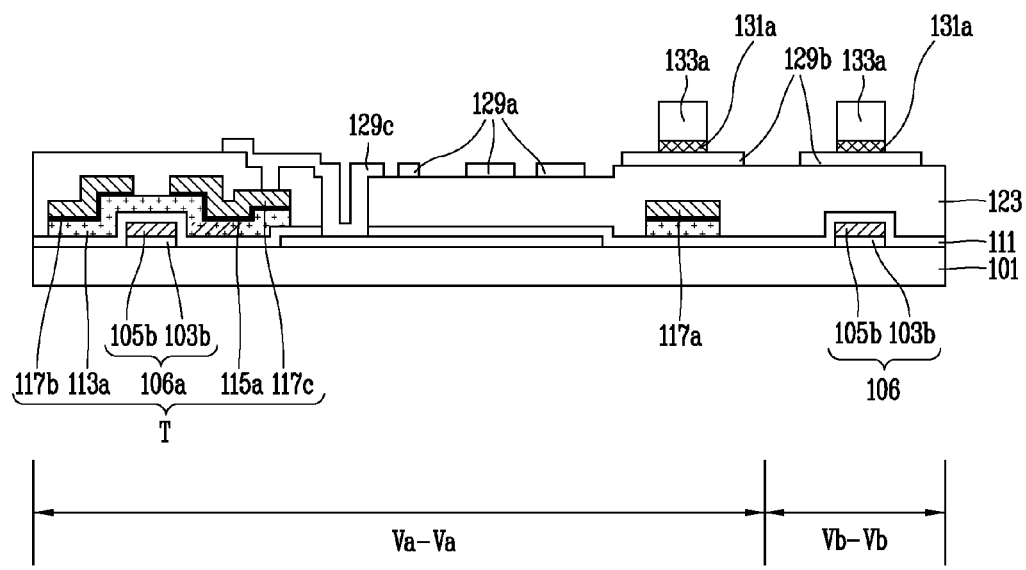
Figure 7S:
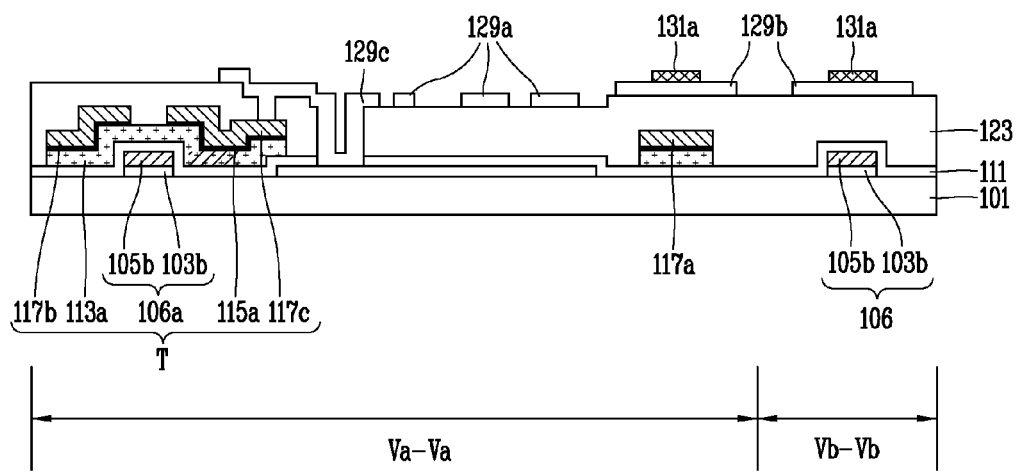
Figure 7T:
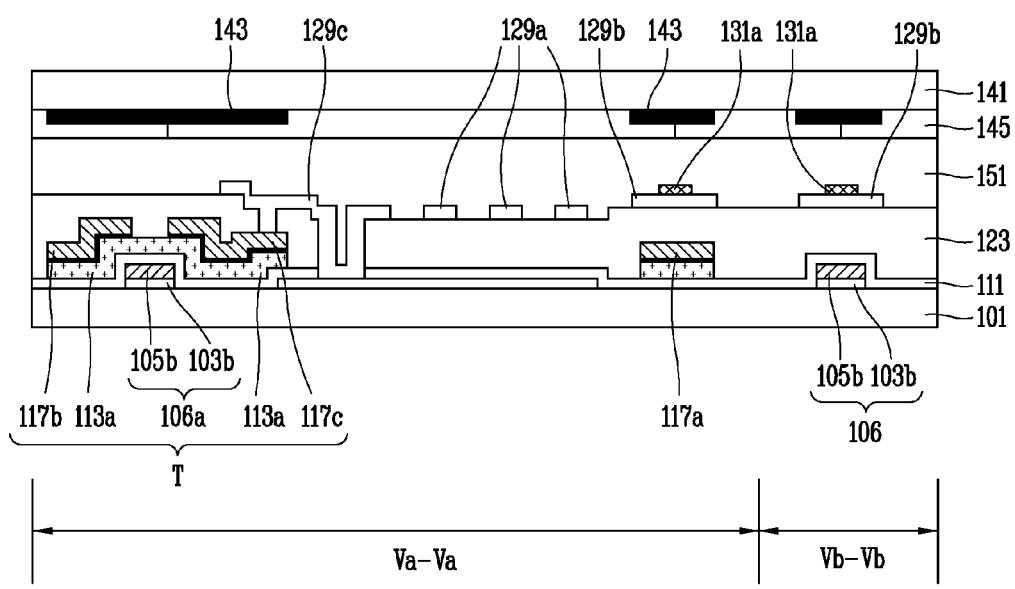

FIGS. 7A through 7T are cross-sectional views illustrating a process of manufacturing an FFS-mode LCD device according to an embodiment of the present disclosure.

As illustrated in FIG. 7A, a first transparent conductive layer 103 and a first metal layer 105 are sequentially deposited on a transparent insulating substrate 101 in which a plurality of pixel regions are defined, through a sputtering method. Here, the first transparent conductive layer 103 is formed of any one selected from the group consisting of indium tin oxide (ITO) and indium zinc oxide (IZO). Also, the first metal layer 105 is formed of at least one selected from the conductive metal group consisting of aluminum (Al), tungsten (W), copper (Cu), molybdenum (Mo), chromium (Cr), titanium (Ti), moly-tungsten (MoW), moly-titanium (MoTi), copper/moly-titanium (Cu/MoTi).

Next, a photoresist having high transmissivity is applied to an upper portion of the metal layer 105 to form a first photosensitive film 107.

Subsequently, the first photosensitive film 107 is exposed using a first diffraction mask 109 including a light blocking region 109a, a translucent region 109b, and a transmission region 109c. Here, the light blocking region 109a of the first diffraction mask 109 is positioned above the first photosensitive film 107 corresponding to a gate line, a gate electrode, and a gate pad formation region, and the translucent region 109b of the first diffraction mask 109 is positioned above the first photosensitive region 107 corresponding to the pixel electrode region.

Also, as the first diffraction mask 109, a half-tone mask or any other mask using diffraction characteristics, as well as a slit mask using a diffraction effect of light, may be used.

Thereafter, as illustrated in FIG. 7B, after the exposing process is performed, the first photosensitive film 107 is selectively removed through a developing process to form first pattern portions 107a corresponding to the gate line, gate electrode and gate pad formation region and a second pattern portion 107b corresponding to the pixel electrode formation region.

Here, since light has not transmitted through the first pattern portions 107a, the first pattern portions 107a are maintained to have the thickness of the first photosensitive film 107 as is, but in case of the second pattern portion 107b, a partial amount of light has transmitted through the second pattern portion 107b, having removed the second pattern portion 107b by a predetermine thickness, and thus, the second pattern portions 107b has a thickness smaller than that of the first pattern portion 107a.

Subsequently, as illustrated in FIG. 7C, the first metal layer 105 and the first transparent conductive layer 103 are patterned using the first pattern portions 107a and the second pattern portion 107b of the photosensitive film as masks to form a gate line 10, a gate electrode 106a protruding from the gate line 106, and a pixel electrode 103a. Here, when the first metal layer 105 and the first transparent conductive layer 103 are patterned, a dummy metal layer pattern 105a is also formed on the pixel electrode 103a. The gate line 106 and the gate electrode 106a are formed as a stacked structure of the transparent conductive pattern 103b and the first metal layer pattern 105b.

Also, as illustrated in FIG. 4, the pixel electrode 103a is formed on the entire surface of the pixel region and space apart from the gate line 10 and the data line (not shown, please refer to 117a of FIG. 7H).

Thereafter, as illustrated in FIG. 7D, an ashing process is performed to remove the second pattern portion 107b on the dummy metal layer pattern 105a and portions of the first pattern portions 107a on the gate line 106 and the gate electrode 106a to expose the dummy metal layer pattern 105a.

Subsequently, as illustrated in FIG. 7E, using the first pattern portions 107a partially etched in thickness through the ashing process, the exposed dummy metal layer pattern 105a is removed to expose the pixel electrode 103a.

Thereafter, the first pattern portions 107a on the gate line 106 and the gate electrode 106a are removed.

Subsequently, as illustrated in FIG. 7F, after the first pattern portions 107a are removed, a gate insulating layer 111 formed of a silicon nitride (SiNx) or a silicon oxide film ($SiO_2$) is formed on the entire surface of the substrate including the pixel electrode 103a, and an amorphous silicon layer (a-Si:H) 113, an amorphous silicon layer (n+ or p+) 115 including an impurity, and a second metal layer 117 are sequentially stacked on the gate insulating layer 111.

Here, the amorphous silicon layer (a-Si:H) 113 and the amorphous silicon layer (n+ or p+) 115 including an impurity are deposited through a chemical vapor deposition (CVD) method, and the second metal layer 117 is deposited through a sputtering method. Here, the CVD method and the sputtering method are mentioned as the deposition method, but any other deposition method may also be used according to circumstances.

The second metal layer 117 may be formed of at least one selected from the conductive metal group consisting of aluminum (Al), tungsten (W), copper (Cu), molybdenum (Mo), chromium (Cr), titanium (Ti), moly-tungsten (MoW), moly-titanium (MoTi), copper/moly-titanium (Cu/MoTi).

Thereafter, as illustrated in FIG. 7G, a photoresist having high transmissivity is applied to the second metal layer 117 to form a second photosensitive film 119.

Subsequently, an exposing process is performed on the second photosensitive film 119 by using a second diffraction mask 121 including a light shielding portion 121a, a semi-transmissive portion 121b, and a transmission portion 121c.

Here, the light shielding portion 121a of the second diffraction mask 121 is positioned above the second photosensitive film 119 corresponding to a data pad formation region together with a data line, source electrode and drain electrode formation region, and the semi-transmissive portion 121b of the second diffraction mask 121 is positioned above the second photosensitive film 119 corresponding to a channel formation region of a TFT.

Also, instead of the second diffraction mask 121, a mask using a diffraction effect of light, for example, a half-tone mask or any other mask may also be used.

Subsequently, as illustrated in FIG. 7H, the second photosensitive film 119 is etched through a developing process after the exposing process to form first pattern portions 119a corresponding to the data line, source electrode and the drain electrode formation region and a second pattern portion 119b corresponding to the channel formation region. In this case, since light has not transmitted through the first pattern portions 119a, the first pattern portions 119a are maintained to have the thickness of the second photosensitive film 119 as is, but in case of the second pattern portion 119b, a partial amount of light has transmitted through the second pattern portion 119b, having removed the second pattern portion 119b by a predetermined thickness, and thus, the second pattern portion 119b is thinner than the first pattern portions 119a.

Thereafter, the second metal layer 117, the amorphous silicon layer 115, and the amorphous silicon layer 113 are sequentially patterned using the first pattern portions 119a and the second pattern portion 119b as masks to form an active layer 113a and an ohmic contact layer 115a on the gate insulating layer 111 corresponding to the gate electrode 106a, together with a data line 117a perpendicular to the gate electrode 106a.

Subsequently, as illustrated in FIG. 7I, the second pattern portion 119b corresponding to the channel formation region together with partial thicknesses of the first pattern portions 119a corresponding to the source electrode and drain electrode formation region are completely removed through an ashing process. Here, an upper surface of the second metal layer 117 overlapping an upper portion of the channel region is exposed outwardly.

Thereafter, the exposed portion of the second metal layer 117 is etched by using the first pattern portions 119a whose partial thicknesses have been removed, to form a source electrode 117b and a drain electrode 117c which are spaced apart from one another. In this case, a portion of the ohmic contact layer 115a in the upper portion of the channel region is exposed outwardly.

Subsequently, as illustrated in FIG. 7J, the ohmic contact layer 115a exposed between the source electrode 117b and the drain electrode 117c is etched by using the remaining first pattern portion 119a of the second photosensitive film as a mask, to separate them. Here, a channel region is formed in an active layer 113a below the etched ohmic contact layer 115a.

Thereafter, as illustrated in FIG. 7K, the first pattern portion 119a of the second photosensitive film is removed, and one of an inorganic insulating material such as silicon nitride (SiNx) or a silicon oxide film ($SiO_2$) or an organic insulating material including photoacryl is deposited on the entire surface of the substrate to from a passivation layer 123, and a photoresist having high transmissivity is applied to the passivation layer 123 to form a third photosensitive film 123. In this case, when the passivation layer 123 is formed of an inorganic insulating material or an organic insulating material, a structure of a common electrode formed thereafter may be altered to be formed. Namely, in the case in which the passivation layer 123 is formed of an inorganic insulating material or an organic insulating material, since capacitance between the common electrode and the data line is varied, and thus, transmissivity may be changed.

Thus, in order to prevent a reduction in transmissivity according to the case in which an organic insulating material or an inorganic insulating material is used to form the passivation layer, the common electrode 129b may be formed to overlap the data line 117a or may be formed not to overlap the data line 117a.

Subsequently, as illustrated in FIG. 7L, exposing and developing processes based on photolithography using an exposure mask (not shown) are performed on the third photosensitive film 125 to form a third photosensitive film pattern 125a.

Thereafter, as illustrated in FIG. 7M, the passivation layer 123 and the gate insulating layer 111 below the passivation layer 123 are selectively etched by using the third photosensitive film pattern 125a as an etching mask to form a drain contact hole 127a exposing the drain electrode 117c and a pixel electrode contact hole 127b exposing the pixel electrode 1003a.

Subsequently, as illustrated in FIG. 7N, the third photosensitive film pattern 125a is removed and a second transparent conductive layer 129 is deposited on the passivation layer 123 including the drain contact hole 127a and the pixel electrode contact hole 127b through a DC magnetron sputtering method. Here, as a material of the second transparent conductive layer 129, any one selected from the transparent material group consisting of ITO and IZO is used.

Thereafter, a third metal layer 131 is deposited on the second transparent conductive layer 129. Here, the third metal layer 131 is formed of at least one selected from the conductive metal group consisting of aluminum (Al), tungsten (W), copper (Cu), molybdenum (Mo), chromium (Cr), titanium (Ti), moly-tungsten (MoW), moly-titanium (MoTi), copper/moly-titanium (Cu/MoTi).

Subsequently, a photoresist having high transmissivity is applied to the third metal layer 131 to form a fourth photosensitive film 133.

Thereafter, an exposing process is performed on the fourth photosensitive film 131 by using a third diffraction mask 135 including a light shielding portion 135a, a semi-transmissive portion (or a semi-transmissive portion) 135b, and a transmission portion 135c.

Here, the light shielding portion 135a of the third diffraction mask 135 is positioned above the fourth photosensitive film 133 corresponding to a third metal pattern formation region, and the semi-transmissive portion 135b of the third diffraction mask 135 is positioned above the fourth photosensitive film 133 corresponding to a first common channel formation region of a TFT. Instead of the third diffraction mask 135, a mask using a diffraction effect of light, for example, a half-tone mask or any other mask may also be used.

Subsequently, as illustrated in FIG. 7O, the fourth photosensitive film 133 is etched through a developing process after the exposing process to form a first pattern portion 133a corresponding to a third metal layer pattern formation region and a second pattern portion 133b corresponding to the first common electrode formation region. In this case, since light is not transmitted, the first pattern portion 133a is maintained to have the thickness of the fourth photosensitive film 133, but in case of the second pattern portion 133b, a partial amount of light is transmitted to remove the second pattern portion 133b by a predetermined thickness, and thus, the second pattern portion 133b is thinner than the first pattern portion 133a.

Thereafter, as illustrated in FIG. 7P, the third metal layer 131 and the second transparent conductive layer 129 below the third metal layer 131 are sequentially etched using the first pattern portion 133a and the second pattern portion 133b as masks to form a pixel electrode connection pattern 129c electrically connecting the pixel electrode 103a and the drain electrode 117c, together with a plurality of common electrodes 129a and second common electrodes 129b.

Here, the first and second common electrodes 129a and 129b may be formed above the pixel region including the data line 117a and the gate line 106 or may be formed above the pixel region including the gate line 106 excluding the data line 117a.

In particular, when the passivation layer 123 is formed to be thick with photoacryl, an organic insulating material, having a thickness ranging from about 2 to 3 μm, the second common electrodes 129b may be formed above the pixel region including the data line 117a and the gate line 106. This is because, since the passivation layer 123 is formed of photoacryl, a thick organic insulating material, a storage capacitance generated between the common electrode 129a and the data line 117a is not large.

Meanwhile, when the passivation layer 123 is formed of silicon nitride (SiNx) or silicon oxide film (SiO$_2$), an inorganic insulating material, and has a thickness ranging from about 3000 to 5000 Å, relatively thin, compared with an organic insulating material, the second common electrodes 129b may be formed above the pixel region and the gate line 106 excluding the data line 117a. This is because, in the case in which the passivation layer 123 is formed of an inorganic insulating material having a thickness smaller than that of photoacryl, when the second common electrodes 129b overlap the data line 117a, storage capacitance generated between the second common electrodes 129b and the data line 117a can be increased.

Subsequently, as illustrated in FIG. 7Q, the entirety of the second pattern portion 133b together with a partial thickness of the first pattern portion 133a above the third metal layer 131 are completely removed through an ashing process, exposing an upper surface of the metal layer 131 below the second pattern portion 133b outwardly.

Thereafter, as illustrated in FIG. 7R, the exposed metal layer 131 is etched by using the first pattern portion 133a whose partial thickness has been removed, to form third metal layer patterns 131a on the second common electrodes 129b and expose the first common electrodes 129a, the second common electrodes 129b, and the pixel electrode connection pattern 129c. In this case, the third metal layer patterns 131a and the second common electrodes 129b below the third metal layer patterns 131a form a common electrode having a dual-layer structure.

In particular, the second common electrodes 129b form the common electrode having a dual-layer structure together with the third metal layer patterns 131a, and are formed on the passivation layer 123 such that they overlaps the data line 117a and the gate line 106. Here, it is described that the third metal layer patterns 131a are formed on the second common electrodes 129b overlapping both the data line 117a and the gate line 106, but the present disclosure is not limited thereto, and when applied to an LCD device of a large model, the third metal layer pattern 131a may be formed only on the second common electrode 129b overlapping either the gate line 106 or the data line 117a.

In this manner, the first common electrodes 129a and the second common electrodes 129b are integrally formed, and the third metal layer patterns 131a are formed only on the second common electrodes 129b overlapping the data line 117a and the gate line 106. It may be advantageous for a line width of the third metal layer patterns 131a to be thinner than those of the data line 117a and the gate line 106 in terms of transmissivity, but the present disclosure is not limited thereto and the line width of the third metal layer patterns 131a may be greater than or equal to those of the data line 117a and the data line 106.

The second transparent conductive layers of the first and second common electrodes 129a and 129b may be formed to have a thickness ranging from 100 to 1000 Å, and the third metal layer pattern 131a may be formed to have a thickness ranging from 500 to 3000 Å.

Subsequently, as illustrated in FIG. 7S, the remaining first pattern portions 133a are removed and a lower alignment layer (not shown) is formed on the entire surface of the substrate including the plurality of first common electrodes 129a and second common electrodes 129b, thus completing the process of manufacturing a TFT array substrate of an FFS-mode LCD device according to an embodiment of the present disclosure.

Thereafter, as illustrated in FIG. 7T, a black matrix BM 143 is formed in order to block transmission of light to a region, excluding the pixel region, on a color filter substrate 141 attached to the TFT substrate, namely, the insulating substrate 101 with a gap therebetween.

Subsequently, red, green, and blue color filter layers 145 are formed in the pixel region of the color filter substrate 141. Here, the black matrix 143 is positioned between the red, green, and blue color filter layers 145 on the color filter substrate 141.

The black matrix 143 is disposed above regions, for example, the TFT T, the gate line 106, and the data line 117a, excluding the pixel region of the insulating substrate 101, in an overlapping manner when the color filter substrate 141 and the TFT substrate, namely, the insulating substrate 101, are attached. In particular, since the second common electrodes 129b covers the data line 117a, blocking light to a degree, and thus, the black matrix 143 may not need to be formed to completely overlap the data line 117a. Namely, in the related art, since the data line is not shielded with a common electrode, a line width of a black matrix is formed to be large in order to shield the data line. In contrast, in the present disclosure, since the data line 117a can be shielded with the second common electrode 129b, a line width of the black matrix 143 may not need to be formed to be large, and thus, transmissivity can be maximized as much.

Thereafter, although not shown, an upper alignment layer (not shown) is formed on the color filter layer 145 to align liquid crystals in a predetermined direction, thus completing the process of manufacturing the color filter array substrate.

Subsequently, although not shown, a liquid crystal layer 151 is formed between the insulating substrate 101 and the color filter substrate 141, thus manufacturing the FFS-mode LCD device according to an embodiment of the present disclosure.

In this manner, in the FFS mode LCD device according to an embodiment of the present disclosure in which a common electrode is applied as a top structure, the metal layer pattern is stacked on the common electrodes overlapping both the data line and the gate line or only on the common electrode overlapping one of the gate line and the data line to form the common electrode as a dual-layer structure, instead of the existing common electrode having a single layer structure formed of only a transparent conductive material. Thus, overall resistance of the common electrode is reduced, improving quality due to resistance of the common electrode.

Also, in the FFS mode LCD device according to an embodiment of the present disclosure in which a common electrode is applied as a top structure, since the overall resistance of the common electrode is reduced by stacking the metal layer pattern on the common electrodes overlapping both the data line and the gate line or only on the common electrode overlapping one of the gate line and the data line to form the common electrode as a dual-layer structure, there is no need to additionally form a common line, such as in the related art, in order to reduce resistance of the common electrode in applying to a large mode, transmissivity can be improved.

In addition, in the FFS mode LCD device according to an embodiment of the present disclosure in which a common electrode is applied as a top structure, the common electrode having a dual-layer structure can be formed by using a diffraction mask without performing an additional masking process.

Hereinafter, an LCD according to another embodiment of the present disclosure will be described with reference to FIGS. 8 through 10.

Figure 8:
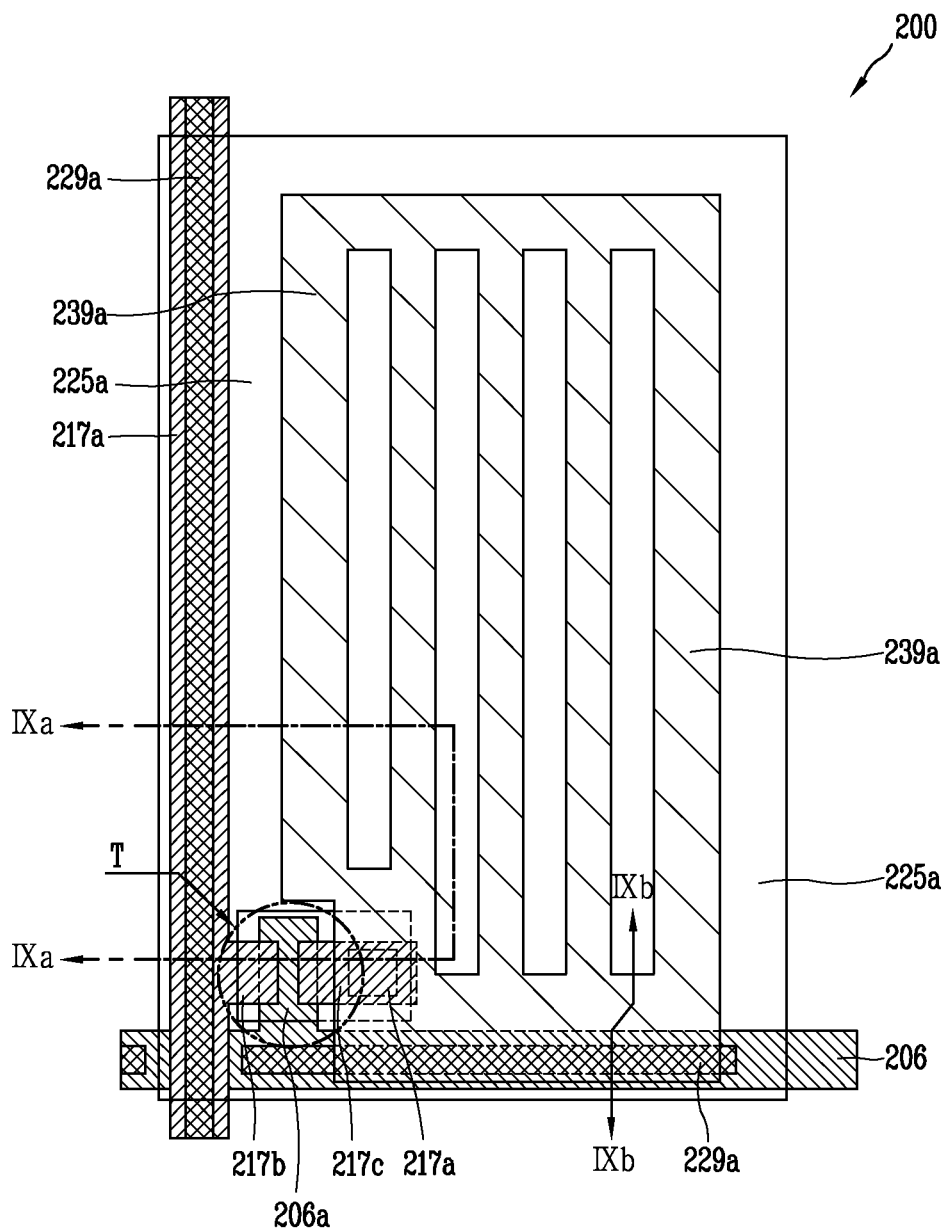
FIG. 8 is a plan view of an FFS-mode LCD device according to another embodiment of the present disclosure.

FIG. 8 is a plan view of an FFS-mode LCD device according to another embodiment of the present disclosure.

Figure 9:
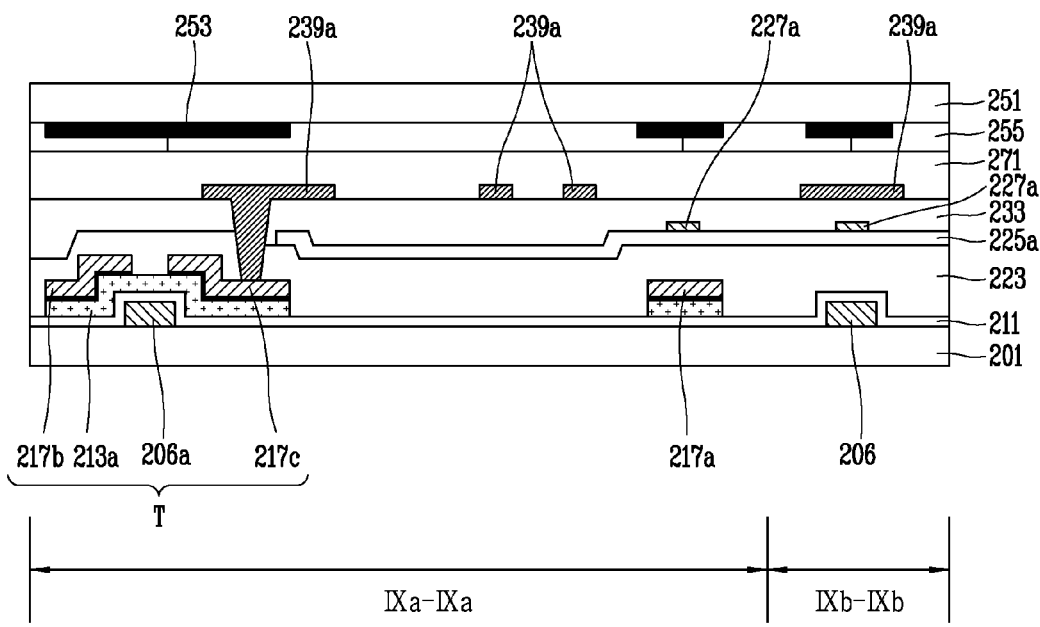
FIG. 9 is a cross-sectional view taken along lines IXa-IXa and IXb-IXb of FIG. 8, illustrating the FFS-mode LCD device according to another embodiment of the present disclosure.

FIG. 9 is a cross-sectional view taken along lines IXa-IXa and IXb-IXb of FIG. 8, illustrating the FFS-mode LCD device according to another embodiment of the present disclosure.

Referring to FIGS. 8 and 9, an FFS-mode LCD device 200 according to another embodiment of the present disclosure in which a pixel electrode is provided as a top structure includes a gate line 206 formed in one direction on one surface of an insulating substrate 201; a data line 217a crossing the gate line 206 to define a pixel region; a thin film transistor (TFT) T formed at the intersection of the gate line 206 and the data line 217a; a first passivation layer 233 formed on the entire surface of the substrate including the TFT T and exposing a portion of the TFT T; a common electrode 225a formed in the first passivation layer 223 of the entire surface of the substrate; a metal layer pattern 229b formed on the common electrode 225a overlapping at least one of the data line 217a and the gate line 206; a second passivation layer 233 formed on the entire surface of the substrate including the metal layer pattern 229b and exposing a portion of the TFT T; and a plurality of pixel electrodes 239a formed to overlap the common electrode 225a on the second passivation layer 233 and electrically connected to the TFT T.

Here, the large common electrode 225a is disposed on the entire surface of the insulating substrate 201, a TFT array substrate, namely, on the first passivation layer 223, and the bar-shaped pixel electrodes 239a are disposed to be spaced apart from one another by a predetermined distance with the second passivation layer 233 interposed therebetween above the common electrode 225a. The common electrode 225a is disposed on the first passivation layer 223 overlapping the gate line 206 and the data line 217a.

Here, portions other than the portions of the common electrode 225a overlapping the gate line 206 and the data line 217a are configured as a single layer structure. Namely, a metal layer pattern 229a may be formed on the common electrode 225a overlapping at least one of the data line 217a and the gate line 206. For example, the metal layer pattern 229a may be formed on the common electrode 225a overlapping the data line 217a and the gate line 206, or on the common electrode 225a overlapping one of the gate line 206 and the data line 217a to form a dual-layer structure.

Figure 10:
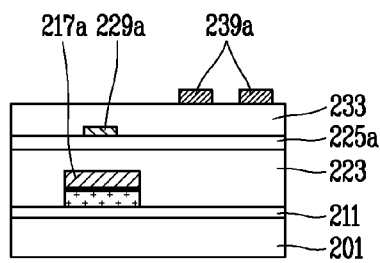
FIG. 10 includes cross-sectional views illustrating a second common electrode having a dual-layer structure overlapped on a data line and a gate line in a thin film transistor array substrate of an FFS-mode LCD device according to another embodiment of the present disclosure, in which (a) is a cross-sectional view illustrating the second common electrode overlapping a data line and (b) is a cross-sectional view illustrating the second common electrode overlapping a gate line.
Figure 10:
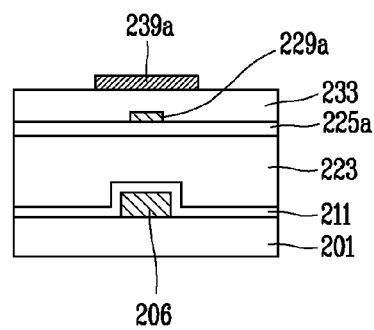

FIG. 10 includes cross-sectional views illustrating a second common electrode having a dual-layer structure overlapped on a data line and a gate line in a thin film transistor array substrate of an FFS-mode LCD device according to another embodiment of the present disclosure, in which (a) is a cross-sectional view illustrating the second common electrode overlapping a data line and (b) is a cross-sectional view illustrating the second common electrode overlapping a gate line.

As illustrated in (a) and (b) of FIG. 10, the metal layer patterns 229a are stacked on the common electrodes 225a respectively overlapping the data line 217a and the gate line 206 to form a dual-layer structure, and here, the common electrodes 225a are disposed on the passivation layer 223 to overlap the data line 217a and the gate line 206. Here, it is illustrated that the metal layer patterns 229a are formed on the common electrodes 225a overlapping the data line 217a and the gate line 206, but the present disclosure is not limited thereto and, for example, in case of an LCD device of a large model, the metal layer pattern 131a may be formed only on the common electrode 225a overlapping the gate line 206.

This is because, in case of a large model LCD device, in the related art, a common line is additionally formed to reduce resistance of a common electrode, but in this case, transmissivity is reduced. Thus, in the present disclosure, the metal layer pattern 229a is formed only on the data line 217a, the gate line 206, or the common electrode 225a overlapping one of the lines, reducing resistance of the common electrode, and thus, transmissivity can be improved.

Also, it may be advantageous to form the metal layer pattern 229a formed on the common electrode 225a overlapping the data line 217a and the gate line 206 such that a line width thereof is narrower than those of the data line 217a and the gate line 206 in terms of a transmissivity, but the present disclosure is not limited thereto and the metal layer pattern 229a may be formed to have a line width equal to or greater than those of the data line 217a and the gate line 206.

The common electrode 225a may be formed of a transparent conductive material such as ITO or IZO.

The metal layer patterns 229a on the second common electrode 225a may be formed of one or more selected from the conductive metal group consisting of aluminum (Al), tungsten (W), copper (Cu), molybdenum (Mo), chromium (Cr), titanium (Ti), moly-tungsten (MoW), moly-titanium (MoTi), copper/moly-titanium (Cu/MoTi) and may have a stacked structure.

The common electrode 225a may be formed to have a thickness ranging from 100 to 1000 Å, and the metal layer patterns 229a may be formed to have a thickness ranging from 500 to 3000 Å.

Thus, since the metal layer patterns 229a are stacked on the common electrodes 225a to form the common electrode having a dual-layer structure, resistance of the common electrode can be reduced.

In this manner, a reference voltage, e.g., a common voltage, for driving liquid crystal is supplied to each pixel through the common electrode 225a. The common electrode 225a overlaps the pixel electrodes 239a with the passivation layer 223 interposed therebetween in each pixel region to form a fringe field.

Also, as illustrated in FIG. 9, the TFT T includes a gate electrode 206a extending in a vertical direction from the gate line 206 formed on the insulating substrate 201, the gate insulating layer 211, an active layer 213a, and an ohmic contact layer 215a formed on the gate electrode 206a, and a source electrode 217b and a drain electrode 217c spaced apart from one another by a distance corresponding to a channel region of the active layer 213a.

The pixel electrode 239a is electrically connected to the drain electrode 217c below a drain contact hole (not shown, please refer to 237 of FIG. 11O).

A lower alignment film (not shown) including the first and second common electrodes 129a and 129b are formed on the entire surface of the substrate.

A black matrix BM 253 for blocking light transmission to a region excluding the pixel region is formed on the color filter substrate 251 attached with the TFT substrate, namely, the insulating substrate 201 with a gap therebetween.

Red, green, and blue color filter layers 255 are formed in a pixel region of the color filter substrate 251. Here, the black matrix 253 is formed between the red, green, and blue color filter layers 255 on the color filter substrate 251.

When the color filter substrate 251 and the insulating substrate 201 as a TFT substrate are attached, the black matrix 253 is disposed to overlap regions excluding the pixel region, for example, the upper portions of the TFT T, the gate line 206, and the data line 217a. Here, a line width of the black matrix 253 overlapping the data line 217a may be equal to or smaller than that of the data line 217a. In particular, the common electrode 225a is disposed above the data line 217a to cover the data line 217a, serving to block light to a degree, and thus, there is no problem even though the black matrix 253 is formed not to completely overlap the data line 217a. Namely, in the related art, the upper side of the data line is not shielded with the common electrode, a line width of the black matrix should be formed to be large enough to shield the data line, but in the present disclosure, the upper side of the data line 217a can be shielded with the common electrode 225a, and thus, the black matrix 253 may not need to be formed to have a large line width, maximizing transmissivity as much.

Also, although not shown, an upper alignment film (not shown) is formed on the color filter layer 255 in order to align liquid crystal in a predetermined direction.

Thus, when a data signal is supplied to the pixel electrode 293a through the TFT T, a fringe field is formed between the common electrode 225a to which a common voltage has been applied and the pixel electrode 239a and liquid crystal molecules aligned in a horizontal direction between the insulating substrate 201 and the color filter substrate 251 rotate due to dielectric anisotropy, changing transmissivity of light that passes through the pixel region according to degrees of rotation of the liquid crystal molecules, thus implementing a gray scale.

In this manner, in the FFS mode LCD device according to another embodiment of the present disclosure in which a pixel electrode is applied as a top structure, the metal layer pattern is stacked on the common electrodes overlapping both the data line and the gate line or only on the common electrode overlapping one of the gate line and the data line to form the common electrode as a dual-layer structure, instead of the existing common electrode having a single layer structure formed of only a transparent conductive material. Thus, overall resistance of the common electrode is reduced, improving quality due to resistance of the common electrode.

Also, in the FFS mode LCD device according to another embodiment of the present disclosure in which a pixel electrode is applied as a top structure, since the overall resistance of the common electrode is reduced by stacking the metal layer pattern on the common electrodes overlapping both the data line and the gate line or only on the common electrode overlapping one of the gate line and the data line to form the common electrode as a dual-layer structure, there is no need to additionally form a common line, such as in the related art, in order to reduce resistance of the common electrode in applying to a large mode, transmissivity can be improved.

A method for manufacturing an FFS-mode LCD device according to another embodiment of the present disclosure configured as described above will be described with reference to FIGS. 11A through 11S.

Figure 11A:
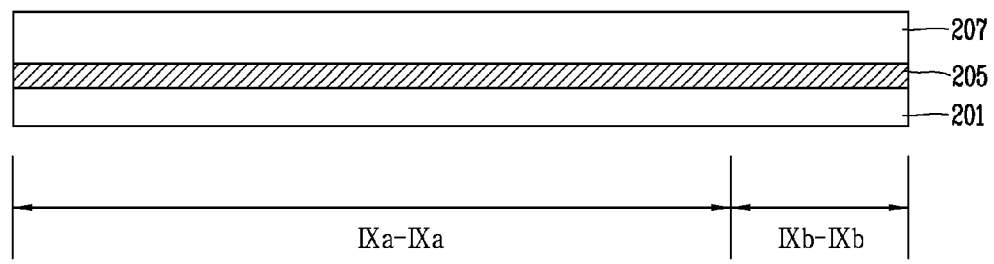
FIGS. 11A through 11S are cross-sectional views illustrating a process of manufacturing an FFS-mode LCD device according to another embodiment of the present disclosure.
Figure 11B:
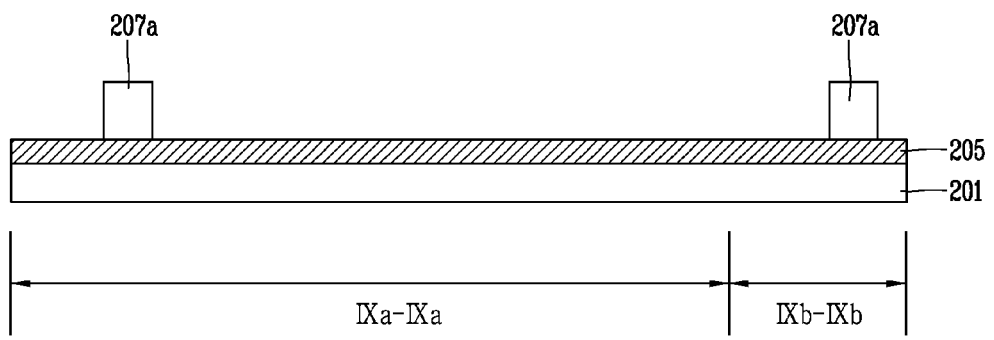
Figure 11C:
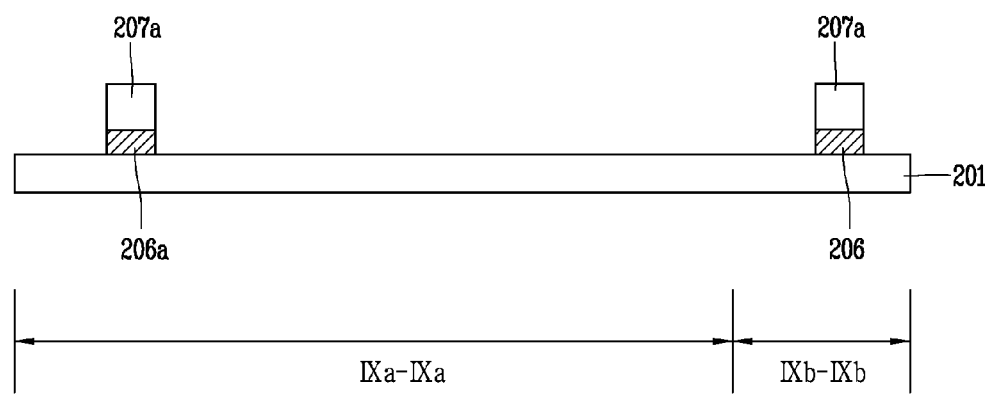
Figure 11D:
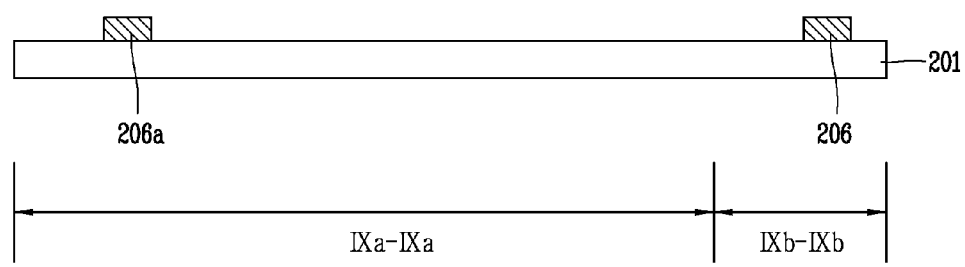
Figure 11E:
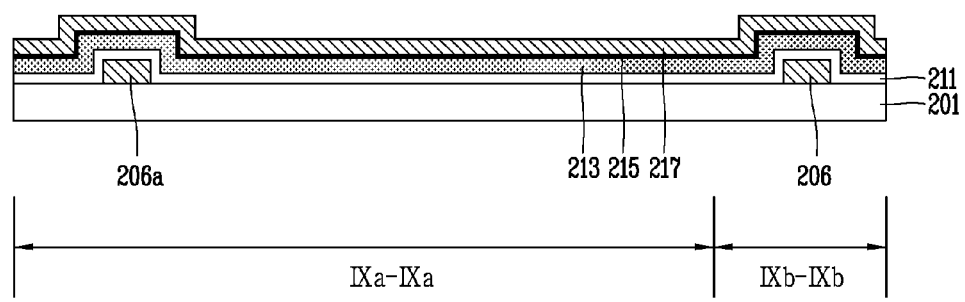
Figure 11F:
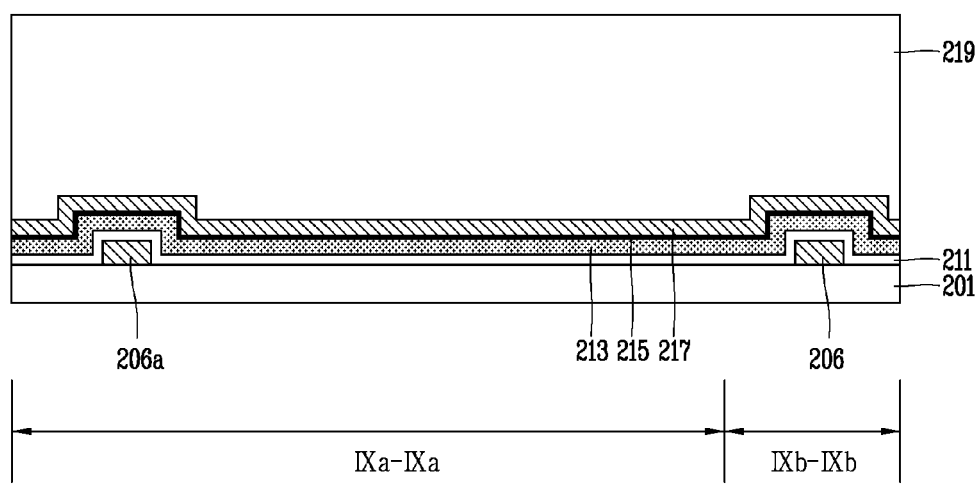
Figure 11G:
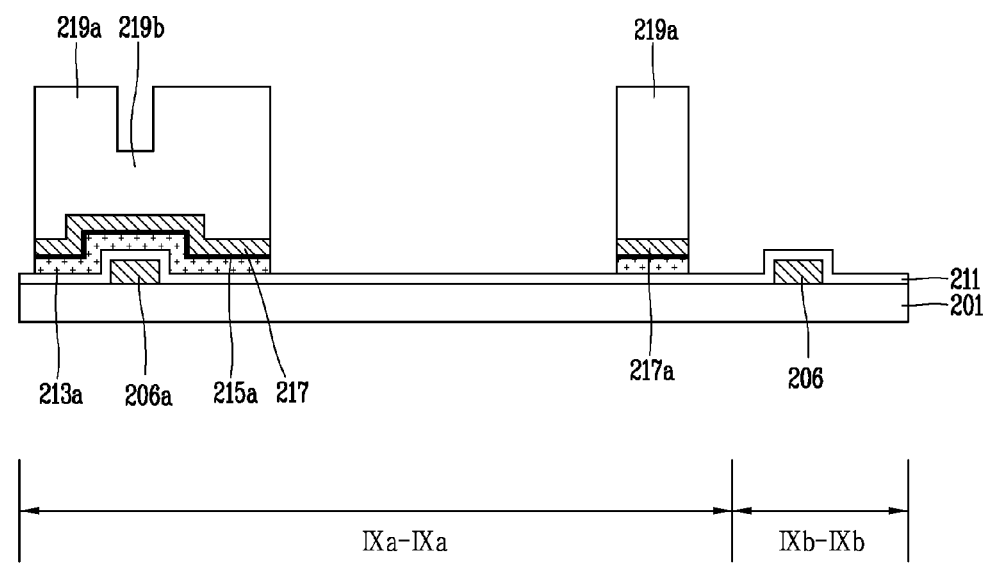
Figure 11H:
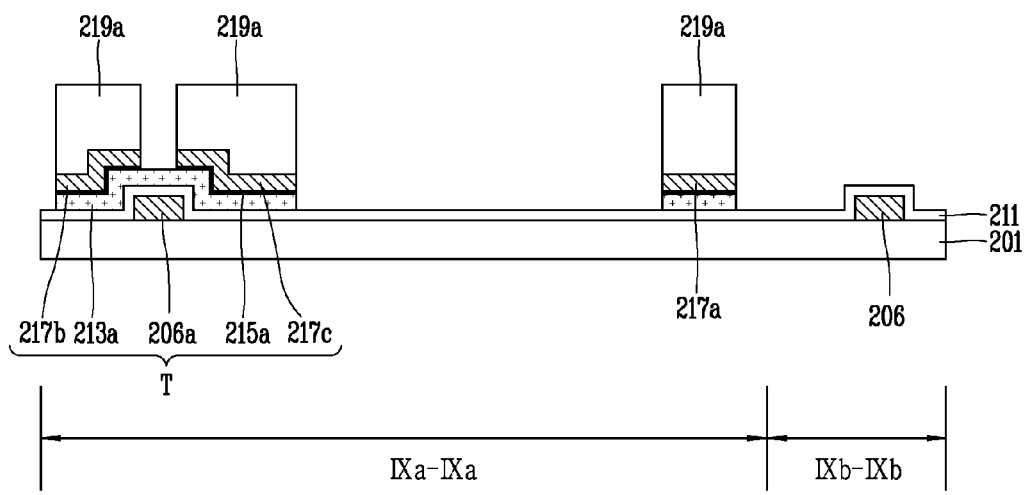
Figure 11I:
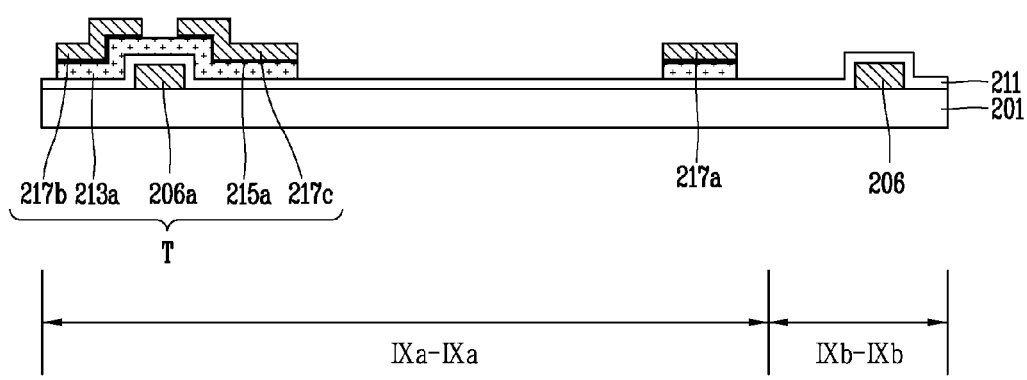
Figure 11J:
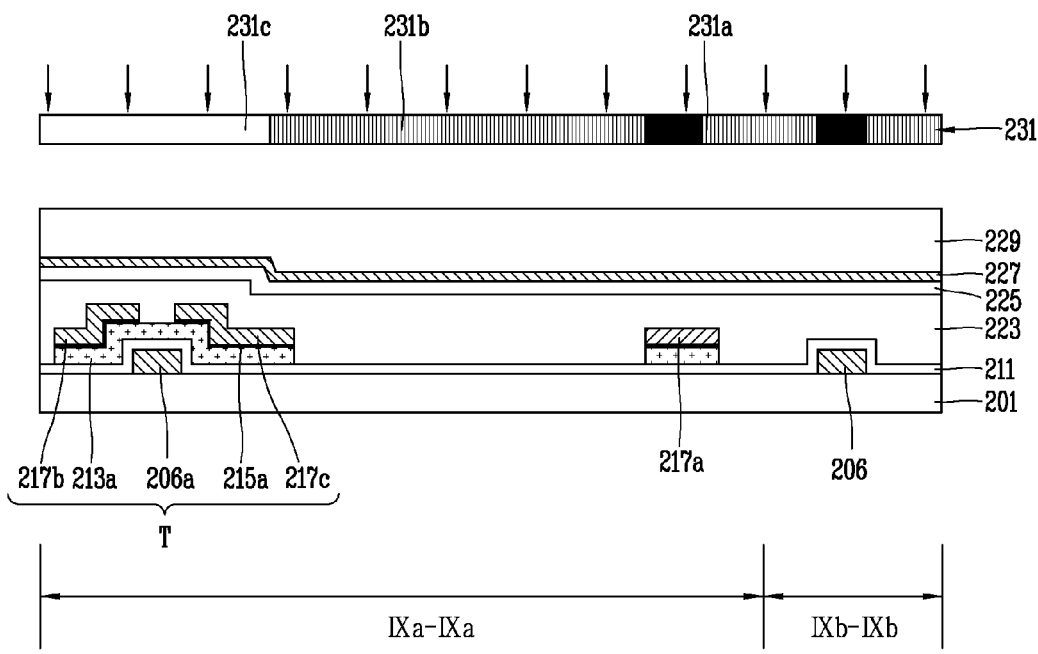
Figure 11K:
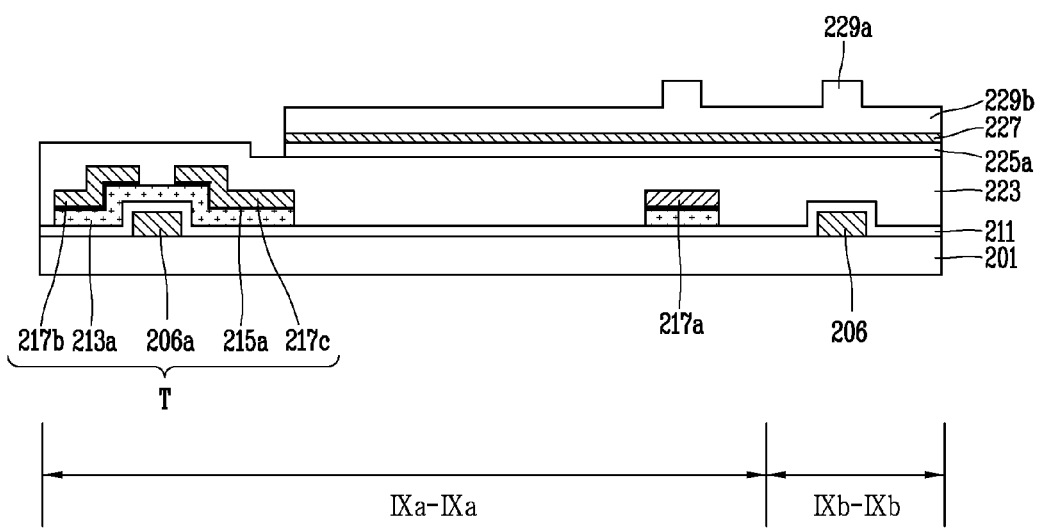
Figure 11L:
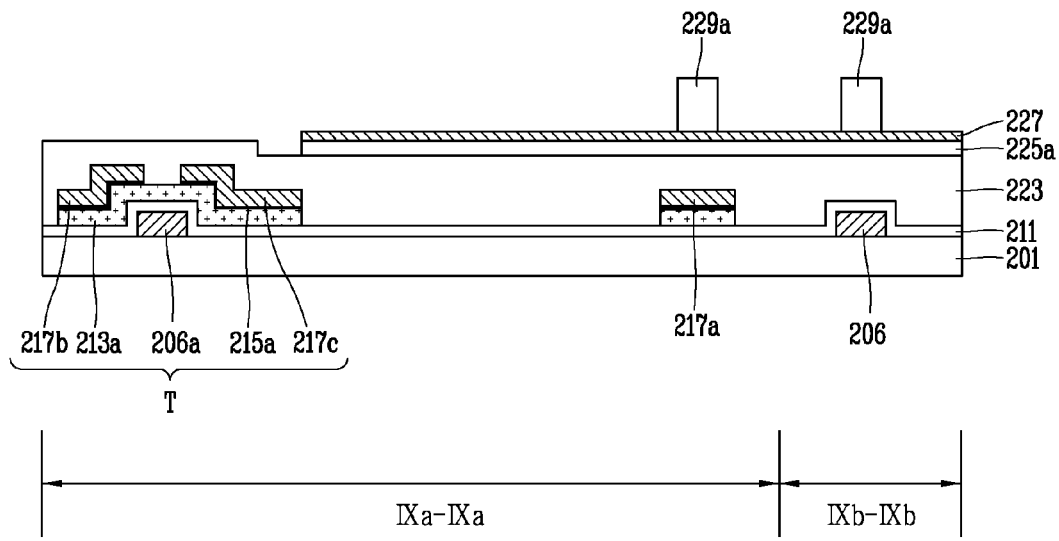
Figure 11M:
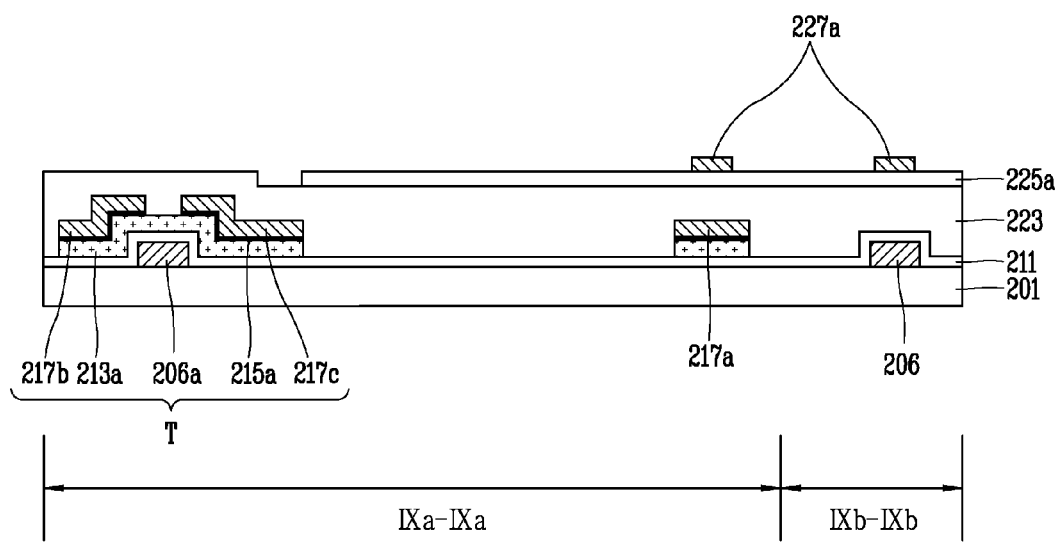
Figure 11N:
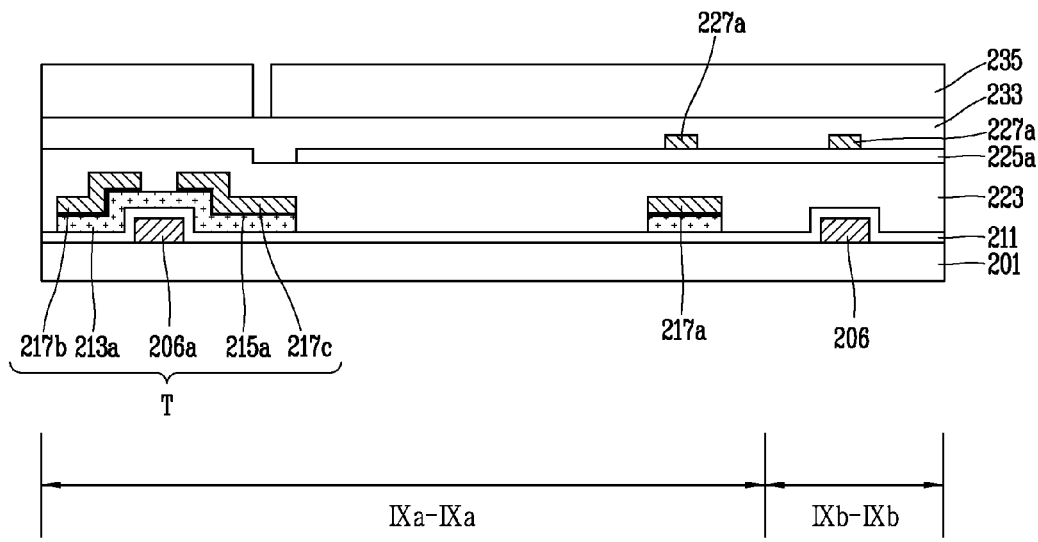
Figure 11O:
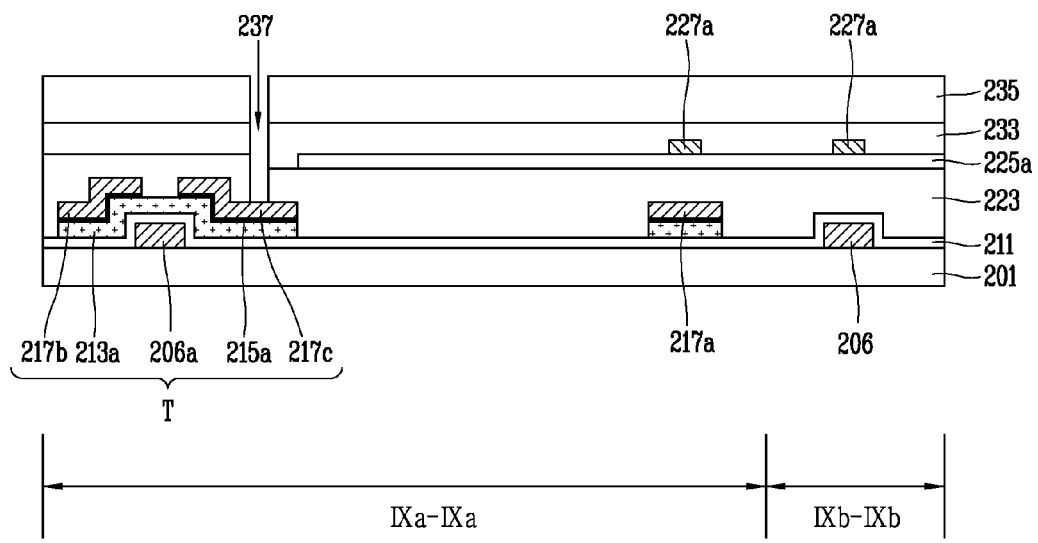
Figure 11P:
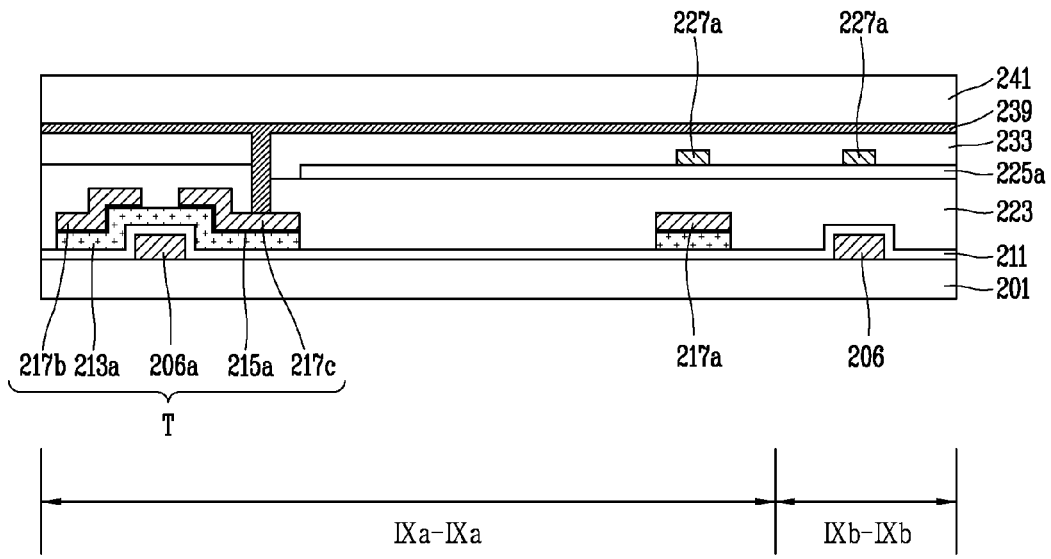
Figure 11Q:
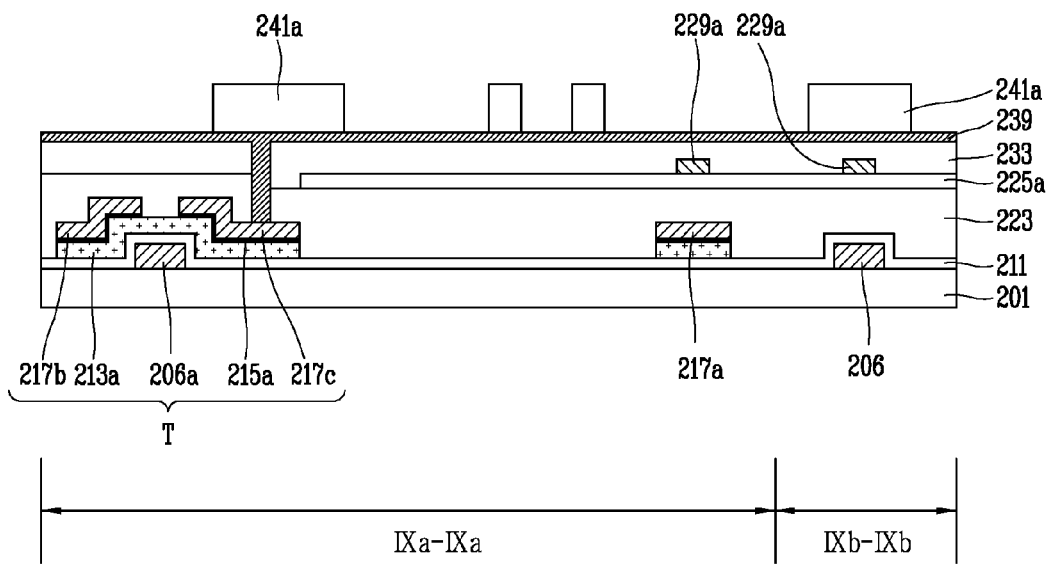
Figure 11R:
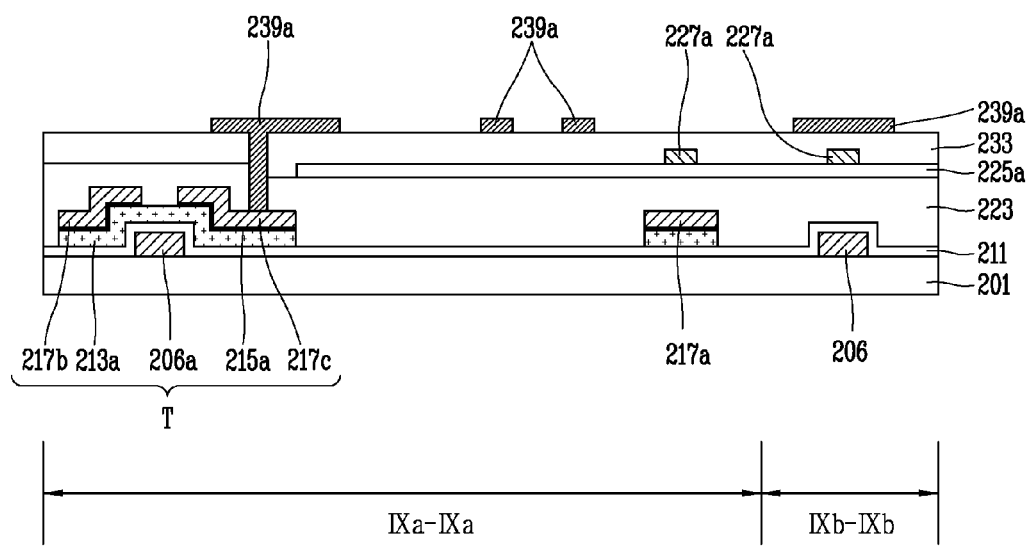
Figure 11S:
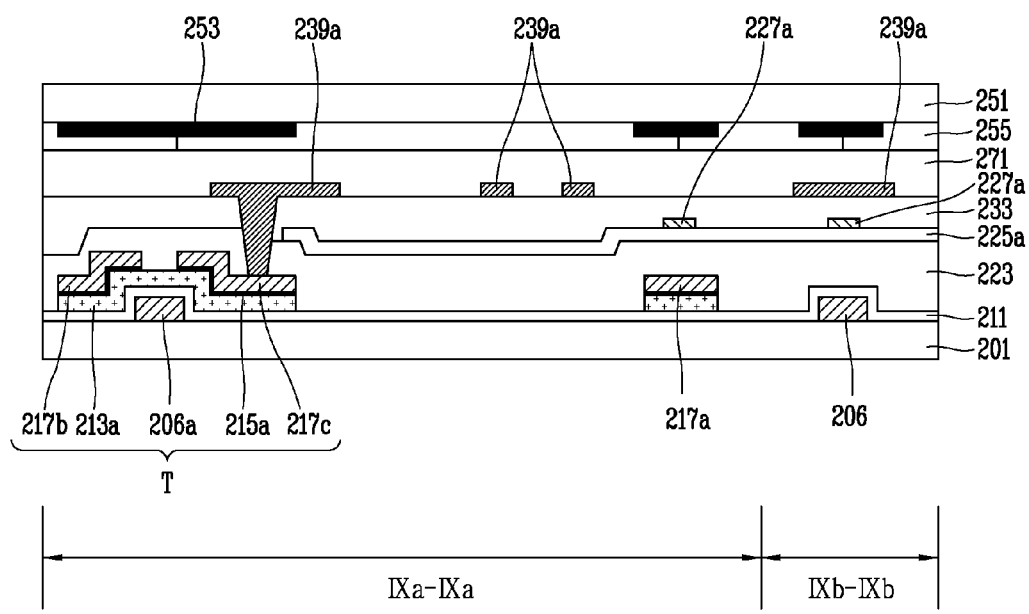

FIGS. 11A through 11S are cross-sectional views illustrating a process of manufacturing an FFS-mode LCD device according to another embodiment of the present disclosure.

As illustrated in FIG. 11A, a first metal layer 205 is deposited on a transparent insulating substrate 201 in which a plurality of pixel regions are defined, through a sputtering method. Here, the first metal layer 205 is formed of any one selected from the conductive metal group consisting of aluminum (Al), tungsten (W), copper (Cu), molybdenum (Mo), chromium (Cr), titanium (Ti), moly-tungsten (MoW), moly-titanium (MoTi), copper/moly-titanium (Cu/MoTi).

Next, a photoresist having high transmissivity is applied to an upper portion of the metal layer 205 to form a first photosensitive film 207.

Subsequently, as illustrated in FIG. 11B, an exposing process and a developing process are sequentially performed on the first photosensitive film 207 through a masking process using an exposure mask (not shown), and the first photosensitive film 207 is subsequently selectively removed to form a first photosensitive film pattern 207a.

Thereafter, as illustrated in FIGS. 11C and 11D, the first metal layer 205 is etched by using the first photosensitive film pattern 207a as an etching mask to form a gate line 206 and a gate electrode 206a protruding from the gate line 206.

Subsequently, as illustrated in FIG. 11E, a gate insulating layer 211 formed of a silicon nitride (SiNx) or a silicon oxide film (SiO$_2$) is formed on the entire surface of the substrate including the gate line 206 and the gate electrode 206a, and an amorphous silicon layer (a-Si:H) 213, an amorphous silicon layer (n+ or p+) 115 including an impurity, and a second metal layer 217 are sequentially stacked on the gate insulating layer 211.

Here, the amorphous silicon layer (a-Si:H) 213 and the amorphous silicon layer (n+ or p+) 215 including an impurity are deposited through a chemical vapor deposition (CVD) method, and the second metal layer 217 is deposited through a sputtering method. Here, the CVD method and the sputtering method are mentioned as the deposition method, but any other deposition method may also be used according to circumstances.

The second metal layer 217 may be formed of at least one selected from the conductive metal group consisting of aluminum (Al), tungsten (W), copper (Cu), molybdenum (Mo), chromium (Cr), titanium (Ti), moly-tungsten (MoW), moly-titanium (MoTi), copper/moly-titanium (Cu/MoTi).

Thereafter, as illustrated in FIG. 11F, a photoresist having high transmissivity is applied to the second metal layer 217 to form a second photosensitive film 219 thereon.

Subsequently, an exposing process is performed on the second photosensitive film 219 by using a first diffraction mask 221 including a light shielding portion 221a, a semi-transmissive portion (or a semi-transmissive portion) 221b, and a transmission portion 221c.

Here, the light shielding portion 221a of the first diffraction mask 221 is positioned above the second photosensitive film 219 corresponding to a data pad formation region together with a data line, source electrode and drain electrode formation region, and the semi-transmissive portion 221b of the first diffraction mask 221 is positioned above the second photosensitive film 219 corresponding to a channel formation region of a TFT.

Also, instead of the first diffraction mask 221, a mask using a diffraction effect of light, for example, a half-tone mask or any other mask may also be used.

Subsequently, as illustrated in FIG. 11G, the second photosensitive film 219 is etched through a developing process after the exposing process to form first pattern portions 219a corresponding to the data line, source electrode, and the drain electrode formation region and a second pattern portion 219b corresponding to the channel formation region. In this case, since light has not been transmitted through the first pattern portions 219a, the first pattern portions 219a is maintained to have the thickness of the second photosensitive film 219 as is, but in case of the second pattern portion 219b, a partial amount of light has transmitted through the second pattern portion 219b, having removed the second pattern portion 219b by a predetermined thickness, and thus, the second pattern portion 219b is thinner than the first pattern portions 219a.

Thereafter, the second metal layer 217, the amorphous silicon layer 215, and the amorphous silicon layer 213 are sequentially patterned using the first pattern portions 219a and the second pattern portion 219b as masks to form an active layer 113a and an ohmic contact layer 215a on the gate insulating layer 211 corresponding to the gate electrode 206a, together with a data line 217a perpendicular to the gate electrode 206a.

Subsequently, as illustrated in FIG. 11H, the second pattern portion 219b corresponding to the channel formation region together with partial thicknesses of the first pattern portions 219a corresponding to the source electrode and drain electrode formation region are completely removed through an ashing process. Here, an upper surface of the second metal layer 217 overlapping an upper portion of the channel region is exposed outwardly.

Thereafter, the exposed portions of the second metal layer 217 and the ohmic contact layer 215a are etched by using the first pattern portions 219a whose partial thicknesses have been removed, to form a source electrode 217b and a drain electrode 217c which are spaced apart from one another. In this case, a portion of the ohmic contact layer 215a in the upper portion of the channel region is etched to expose a portion of the active layer 213a outwardly. Namely, the ohmic contact layer 215a exposed between the source electrode 217b and the drain electrode 217c is etched by using the remaining first pattern portion 219a of the second photosensitive film as a mask, to form a channel region in the active layer 213a below the etched ohmic contact layer 215a.

Subsequently, as illustrated in FIG. 11I, the first pattern portions 219a of the second photosensitive film are removed.

Thereafter, as illustrated in FIG. 11J, one of an inorganic insulating material such as silicon nitride (SiNx) or a silicon oxide film (SiO$_2$) or an organic insulating material including photoacryl is deposited on the entire surface of the substrate to from a passivation layer 223, and thereafter, a first transparent conductive layer 225 and a third metal layer 227 are sequentially deposited on the first passivation layer 223 through a DC magnetron sputtering method. Here, as a material of the first transparent conductive layer 225, any one selected from the transparent material group consisting of ITO and IZO is used. As a material of the third metal layer 227, at least one selected from the conductive metal group consisting of aluminum (Al), tungsten (W), copper (Cu), molybdenum (Mo), chromium (Cr), titanium (Ti), moly-tungsten (MoW), moly-titanium (MoTi), copper/moly-titanium (Cu/MoTi).

In this case, when the passivation layer 223 is formed of an inorganic insulating material or an organic insulating material, a structure of a common electrode formed thereafter may be altered to be formed. Namely, in the case in which the passivation layer 123 is formed of an inorganic insulating material or an organic insulating material, since capacitance between the common electrode and the data line is varied, and thus, transmissivity may be changed.

Thus, in order to prevent a reduction in transmissivity according to the case in which an organic insulating material or an inorganic insulating material is used to form the passivation layer, the common electrode (not shown) may be formed to overlap the data line 217a or may be formed not to overlap the data line 217a.

Subsequently, a photoresist having high transmissivity is applied to the third metal layer 227 to form a fourth photosensitive film 229 thereon.

Thereafter, an exposing process is performed on the fourth photosensitive film 229 by using a second diffraction mask 231 including a light shielding portion 231a, a semi-transmissive portion (or a semi-transmissive portion) 231b, and a transmission portion 231c.

Here, the light shielding portion 121a of the second diffraction mask 231 is positioned above the fourth photosensitive film 229 corresponding to a third metal layer pattern formation region, and the semi-transmissive portion 231b of the second diffraction mask 231 is positioned above the fourth photosensitive film 229 corresponding to a common electrode formation region. Instead of the second diffraction mask 231, a mask using a diffraction effect of light, for example, a half-tone mask or any other mask may also be used.

Subsequently, as illustrated in FIG. 11K, after the exposing process is performed, the fourth photosensitive film 229 is etched through a developing process to form first pattern portions 229a corresponding to the third metal layer pattern formation region and a second pattern portion 229b corresponding to the common electrode formation region. Here, light has not been transmitted through the first pattern portions 229a, and thus, the thickness of the fourth photosensitive film 229 is maintained as is, while a partial amount of light has been transmitted through the second pattern portion 229b, having removed the second pattern portion 229b by a predetermine thickness, and thus, the second pattern portions 229b have a thickness smaller than that of the first pattern portion 229a.

The third metal layer 227 and the first transparent conductive layer 225 below the third metal layer 227 are sequentially etched by using the first pattern portions 229a and the second pattern portion 229b as etching masks to form a large common electrode 225a on the entire surface of the substrate. Here, the common electrode 225a may be formed above the data line 217a and the gate line 206 including the pixel region, or may be formed above the pixel region and the gate line 206 excluding the data line 217a.

In particular, when the passivation layer 223 is formed to be thick with photoacryl, an organic insulating material, having a thickness ranging from about 2 to 3 μm, the common electrodes 225a may be formed above the data line 217a and the gate line 206 including the pixel region. This is because, since the passivation layer 223 is formed of photoacryl, a thick organic insulating material, a storage capacitor generated between the common electrode 225a and the data line 217a is not large.

Meanwhile, when the passivation layer 223 is formed of silicon nitride (SiNx) or silicon oxide film (SiO$_2$), an inorganic insulating material, and has a thickness ranging from about 3000 to 5000 Å, the common electrodes 225a may be formed above the pixel region and the gate line 206 excluding the data line 217a. This is because, in the case in which the passivation layer 223 is formed of an inorganic insulating material having a thickness smaller than that of photoacryl, when the common electrodes 225a overlap the data line 217a, storage capacitor generated between the common electrodes 225a and the data line 217a is increased.

Subsequently, as illustrated in FIG. 11L, the entirety of the second pattern portion 229b together with a partial thickness of the first pattern portion 229a above the third metal layer 227 are completely removed through an ashing process, exposing an upper surface of the third metal layer 227 outwardly.

Thereafter, as illustrated in FIG. 11M, the exposed third metal layer 227 is etched by using the first pattern portion 231a whose partial thickness has been removed, to form third metal layer patterns 227a on the common electrodes 225a overlapping the data line 217a and the gate line 206. In this case, the third metal layer patterns 225a and the common electrodes 225a below the third metal layer patterns 225a form a common electrode having a dual-layer structure.

In particular, the common electrodes 225a form the common electrode having a dual-layer structure together with the third metal layer patterns 227a, and are formed on the passivation layer 223 such that they overlaps the data line 217a and the gate line 206. Here, it is described that the third metal layer patterns 227a on the common electrodes 225a overlap all of the common electrodes 225a above the data line 217a and the gate line 206, but the present disclosure is not limited thereto, and when applied to an LCD device of a large model, the third metal layer patterns 227a may be formed only on the common electrode 225a overlapping one of the gate line 206 or the data line 217a.

In the case of the third metal layer pattern 227a formed on the common electrode 225a overlapping the data line 217a and the gate line 206, it may be advantageous for a line width of the third metal layer patterns 227a to be thinner than those of the data line 217a and the gate line 206 in terms of transmissivity, but the present disclosure is not limited thereto and the line width of the third metal layer patterns 227a may be greater than or equal to those of the data line 217a and the data line 206.

The second transparent conductive layer forming the common electrodes 225a may be formed to have a thickness ranging from 100 to 1000 Å, and the third metal layer pattern 227a may be formed to have a thickness ranging from 500 to 3000 Å.

Subsequently, as illustrated in FIG. 11N, an inorganic insulating material is deposited on the entire surface of the substrate including the third metal layer pattern 227a to form a second passivation layer 233, and a photoresist having high transmissivity is applied to the second passivation layer 233 to form a fifth photosensitive film (not shown) thereon.

Thereafter, the fifth photosensitive film (not shown) is selectively removed through an exposing process and a developing process using an exposure mask to form a fifth photosensitive film pattern 235.

Subsequently, as illustrated in FIG. 11O, the second passivation layer 233 and the first passivation layer 223 below the second passivation layer 233 are sequentially etched by using the fifth photosensitive film pattern 235 as an etching mask to form a drain contact hole 237 exposing the drain electrode 217c.

Thereafter, as illustrated in FIG. 11P, the fifth photosensitive film pattern 235 is removed, and thereafter, a second transparent conductive layer 239 is deposited on the second passivation layer 2333 through a DC magnetron sputtering method. Here, as a material of the second transparent conductive layer 239, any one selected from the transparent material group consisting of ITO and IZO.

Subsequently, a photoresist having high transmissivity is applied to the second transparent conductive layer 239 to form a sixth photosensitive film thereon.

Thereinafter, as illustrated in FIG. 11Q, the sixth photosensitive film 241 is selectively removed through an exposing process and a developing process using an exposing mask to form a sixth photosensitive film pattern 241a.

Subsequently, as illustrated in FIG. 11R, the second transparent conductive layer 239 is etched by using the sixth photosensitive film pattern 241a as an etching mask to form a plurality of pixel electrodes 239a electrically connected to the drain electrode 217c and overlapping the common electrode 225a. In this case, the plurality of pixel electrodes 239a are spaced apart from one another, and overlap the gate line 206 as well as the pixel region formed the data line 217a and the gate line 206 cross each other.

Thereafter, the sixth photosensitive film pattern 241a is removed, and a lower alignment layer (not shown) is subsequently formed on the entire surface of the substrate including the plurality of pixel electrodes 239a, thus completing the process of manufacturing a TFT array substrate of an FFS-mode LCD device according to an embodiment of the present invention in which a pixel electrode is applied as a top structure.

Subsequently, as illustrated in FIG. 11S, a black matrix BM 253 is formed in order to block transmission of light to a region, excluding the pixel region, on a color filter substrate 251 attached to the TFT substrate, namely, the insulating substrate 201 with a gap therebetween.

Thereafter, red, green, and blue color filter layers 255 are formed in the pixel region of the color filter substrate 251. Here, the black matrix 253 is positioned between the red, green, and blue color filter layers 145 on the color filter substrate 251.

The black matrix 253 is disposed above regions, for example, the TFT T, the gate line 206, and the data line 217a, excluding the pixel region of the insulating substrate 201, in an overlapping manner when the color filter substrate 251 and the TFT substrate, namely, the insulating substrate 201, are attached. In particular, since the common electrode 225a covers the data line 217a, blocking light to a degree, and thus, the black matrix 253 may not need to be formed to completely overlap the data line 217a. Namely, in the related art, since the data line is not shielded with a common electrode, a line width of a black matrix is formed to be large in order to shield the data line. In contrast, in the present disclosure, since the data line 217a can be shielded with the common electrode 225a, a line width of the black matrix 253 may not need to be formed to be large, and thus, transmissivity can be maximized as much.

Thereafter, although not shown, an upper alignment layer (not shown) is formed on the color filter layer 255 to align liquid crystals in a predetermined direction, thus completing the process of manufacturing the color filter array substrate.

Subsequently, although not shown, a liquid crystal layer 271 is formed between the insulating substrate 201 and the color filter substrate 251, thus manufacturing the FFS-mode LCD device according to an embodiment of the present disclosure.

In this manner, in the FFS mode LCD device according to another embodiment of the present disclosure in which a pixel electrode is applied as a top structure, the metal layer pattern is stacked on the common electrodes overlapping both the data line and the gate line or only on the common electrode overlapping one of the gate line and the data line to form the common electrode as a dual-layer structure, instead of the existing common electrode having a single layer structure formed of only a transparent conductive material. Thus, overall resistance of the common electrode is reduced, improving quality due to resistance of the common electrode.

Also, in the FFS mode LCD device according to another embodiment of the present disclosure in which a pixel electrode is applied as a top structure, since the overall resistance of the common electrode is reduced by stacking the metal layer pattern on the common electrodes overlapping both the data line and the gate line or only on the common electrode overlapping one of the gate line and the data line to form the common electrode as a dual-layer structure, there is no need to additionally form a common line, such as in the related art, in order to reduce resistance of the common electrode in applying to a large mode, transmissivity can be improved.

In addition, in the FFS mode LCD device according to another embodiment of the present disclosure in which a pixel electrode is applied as a top structure, the common electrode having a dual-layer structure can be formed by using a diffraction mask without performing an additional masking process.

So far, embodiments have been described, but the present disclosure is not limited thereto.

As described above, terms of "comprise" and variations such as "comprises" or "comprising," will be understood to imply the inclusion of stated elements but not the exclusion of any other elements, unless explicitly described to the contrary. Unless indicated otherwise, it is to be understood that all the terms used in the specification, including technical and scientific terms have the same meaning as those that are understood by those skilled in the art to which the present invention pertains. It must be understood that the terms defined by the dictionary are identical with the meanings within the context of the related art, and they should not be ideally or excessively formally defined unless the context clearly dictates otherwise.

The foregoing embodiments and advantages are merely exemplary and are not to be considered as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

It will be apparent to those skilled in the art that various modifications and variations can be made in the liquid crystal display device and method for manufacturing the same of the present invention without departing from the spirit or scope of the invention. Thus, it is intended that the present invention cover the modifications and variations of this invention provided they come within the scope of the appended claims and their equivalents.

What is claimed is:

1. A liquid crystal display device, comprising:
   a substrate;
   a gate line on the substrate;
   a data line crossing the gate line to define a pixel region;
   a thin film transistor (TFT) provided at an intersection between the gate line and the data line;
   a pixel electrode on the entire surface of the pixel region of the substrate;
   an insulating layer on the substrate, the pixel electrode, and the TFT, the insulating layer defining contact holes exposing the TFT and the pixel electrode;
   a pixel electrode connection pattern electrically connecting the pixel electrode and the TFT on the insulating layer;
   a plurality of common electrodes formed of a same material as the pixel electrode connection pattern and spaced apart from one another, at least one of the common electrodes overlapping at least one of the data line and the gate line and other ones of the common electrodes overlapping the pixel electrode in the pixel region; and
   metal layer patterns directly on the at least one common electrode overlapping the at least one of the data line and the gate line.

2. The liquid crystal display device of claim 1, wherein the metal layer patterns are formed on the common electrodes overlapping the data line and the gate line or are formed on the at least one common electrode overlapping the at least one of the gate line and the data line.

3. The liquid crystal display device of claim 1, wherein the common electrodes below the metal layer patterns form common electrodes having a dual-layer structure together with the metal layer patterns.

4. The liquid crystal display device of claim 1, wherein the insulating layer is an organic insulating layer or an inorganic insulating layer.

5. The liquid crystal display device of claim 4, wherein when the insulating layer is an organic insulating layer, respective ones of the common electrodes overlap the data line and the gate line of the pixel region.

6. The liquid crystal display device of claim 4, wherein when the insulating layer is an inorganic insulating layer, respective ones of the common electrodes overlap the data line and the gate line of the pixel region or overlaps the gate line of the pixel region, excluding the data line.

7. A liquid crystal display device, comprising:
   a substrate;
   a gate line on the substrate;
   a gate insulating layer and an active layer on a gate electrode extending from the gate line, a source electrode and a drain electrode spaced apart from one another to define a channel region of the active layer, and a data line extending from the source electrode and crossing the gate line to define a pixel region;
   a first insulating layer provided on the substrate;
   first and second common electrodes provided on the first insulating layer of the substrate in the pixel region;
   a metal layer pattern provided on the second common electrode overlapping at least any one of the data line and the gate line;
   a second insulating layer provided on the substrate including the metal layer pattern; and
   a plurality of pixel electrodes electrically connected to the drain electrode on the second insulating layer and overlapping the common electrodes.

8. The liquid crystal display device of claim 7, wherein the metal layer pattern is formed on the second common electrode overlapping the data line and the gate line or on the second common electrode overlapping one of the gate line and the data line.

9. The liquid crystal display device of claim 7, wherein the second common electrode below the metal layer pattern forms a common electrode having a dual-layer structure together with the metal layer pattern.

10. The liquid crystal display device of claim 7, wherein the first insulating layer is an organic insulating layer or an inorganic insulating layer.

11. The liquid crystal display device of claim 10, wherein when the first insulating layer is an organic insulating layer, the second common electrode overlaps the data line and the gate line including the pixel region.

12. The liquid crystal display device of claim 10, wherein when the first insulating layer is an inorganic insulating layer, the second common electrode overlaps the data line and the gate line including the pixel region or overlaps the pixel region and the gate line excluding the data line.

* * * * *